(12) United States Patent
Hasegawa et al.

(10) Patent No.: US 7,132,175 B2
(45) Date of Patent: **\*Nov. 7, 2006**

(54) GMR MAGNETIC DETECTING ELEMENT COMPRISING CURRENT LIMITING LAYER PROVIDED IN FREE MAGNETIC LAYER AND METHOD OF MANUFACTURING THE DETECTING ELEMENT

(75) Inventors: Naoya Hasegawa, Niigata-ken (JP); Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 60 days.

This patent is subject to a terminal disclaimer.

(21) Appl. No.: 10/607,238

(22) Filed: Jun. 25, 2003

(65) Prior Publication Data
US 2004/0086751 A1 May 6, 2004

(30) Foreign Application Priority Data
Jun. 25, 2002 (JP) .............................. 2002-184044

(51) Int. Cl.
G11B 5/39 (2006.01)
G11B 5/127 (2006.01)
(52) U.S. Cl. .................. 428/811.2; 428/816; 360/324.1
(58) Field of Classification Search ...................... None
See application file for complete search history.

(56) References Cited

U.S. PATENT DOCUMENTS

| | | | |
|---|---|---|---|
| 6,280,813 B1 | 8/2001 | Carey et al. | |
| 6,462,919 B1* | 10/2002 | Mack et al. | 360/327.3 |
| 6,495,275 B1* | 12/2002 | Kamiguchi et al. | 428/692 |
| 6,544,893 B1 | 4/2003 | Eto | |
| 6,594,100 B1 | 7/2003 | Carey et al. | |
| 6,602,612 B1 | 8/2003 | Abarra et al. | |
| 6,707,649 B1* | 3/2004 | Hasegawa et al. | 360/324.12 |
| 6,828,039 B1* | 12/2004 | Sugawara | 428/621 |
| 2002/0051330 A1 | 5/2002 | Van der Heijden et al. | |
| 2002/0054461 A1* | 5/2002 | Fujiwara et al. | 360/324.1 |
| 2002/0097538 A1* | 7/2002 | Seyama et al. | 360/324.11 |
| 2002/0135954 A1* | 9/2002 | Yoshikawa et al. | 360/324.12 |
| 2002/0135956 A1* | 9/2002 | Hasegawa et al. | 360/324.12 |
| 2002/0191451 A1* | 12/2002 | Kishi et al. | 365/200 |

(Continued)

FOREIGN PATENT DOCUMENTS

JP 2001-56924 A 2/2001

(Continued)

OTHER PUBLICATIONS

Derwent Abs. Translation of JP 2003-008108-A (Derwent Acc. No. 2003-090737).*

Primary Examiner—Kevin M. Bernatz
(74) Attorney, Agent, or Firm—Brinks Hofer Gilson & Lione

(57) ABSTRACT

The present invention provides a CPP-type spin-valve magnetic detecting element permitting a decrease in an effective element area even with a large optical element area. A current limiting layer having an insulating portion and a conductive portion is formed in a free magnetic layer to narrow a sensing current and decrease diffusion of the sensing current. Also, the current density of the sensing current flowing through the free magnetic layer can be securely locally increased. Therefore, even when the optical element area of the free magnetic layer in parallel to the film plane is 0.01 μm² or more, the effective element area can be securely decreased, and a CPP-type magnetic detecting element producing large ΔR and high reproduction output can easily be formed.

19 Claims, 21 Drawing Sheets

U.S. PATENT DOCUMENTS

| | | | |
|---|---|---|---|
| 2003/0026049 A1* | 2/2003 | Gill | 360/324.12 |
| 2003/0206384 A1* | 11/2003 | Hoshiya et al. | 360/324.12 |
| 2004/0052008 A1* | 3/2004 | Sugawara | 360/324.11 |
| 2004/0246634 A1* | 12/2004 | Yuasa et al. | 360/324.11 |

FOREIGN PATENT DOCUMENTS

| | | |
|---|---|---|
| JP | 2001-155313 | 6/2001 |
| JP | 2001-256617 | 9/2001 |
| JP | 2001-273613 | 10/2001 |
| JP | 2001-291214 | 10/2001 |

* cited by examiner

GMR MAGNETIC DETECTING ELEMENT COMPRISING CURRENT LIMITING LAYER PROVIDED IN FREE MAGNETIC LAYER AND METHOD OF MANUFACTURING THE DETECTING ELEMENT

BACKGROUND OF THE INVENTION

1. Field of the Invention

The present invention relates to a CPP (current perpendicular to the plane) type magnetic detecting element. Particularly, the present invention relates to a magnetic detecting element permitting a decrease in the effective element size while maintaining a large optical element size, and an effective and easy improvement in reproduction output, and a method of manufacturing the magnetic detecting element.

2. Description of the Related Art

FIG. 28 is a sectional view of the structure of a conventional magnetic detecting element, as viewed from a surface facing a recording medium.

The spin valve magnetic detecting element shown in FIG. 28 comprises a multilayer film 9 comprising an antiferromagnetic layer 2, a pinned magnetic layer 3, a nonmagnetic material layer 4, a free magnetic layer 5, a nonmagnetic material layer 6, a pinned magnetic layer 7, and an antiferromagnetic layer 8, which are laminated in that order from the bottom, electrode layers 1 and 10 formed above and below the multilayer film 9, hard bias layers 11 formed on both sides of the free magnetic layer 5, insulating layers 12 formed below the hard bias layers 11, and insulating layers 13 formed above the hard bias layers 11.

The antiferromagnetic layers 2 and 8 are made of PtMn, the pinned magnetic layers 3 and 7 and the free magnetic layer 5 are made of a ferromagnetic material such as NiFe or the like, the nonmagnetic material layers 4 and 6 are made of Cu, the hard bias layers 11 are made of a hard magnetic material such as CoPt or the like, the insulating layers 12 and 13 are made of alumina, and the electrode layers 1 and 10 are made of a conductive material such as Cr.

The magnetic detecting element shown in FIG. 28 is referred to as a "dual spin-valve magnetic detecting element" in which the nonmagnetic material layer 4 and the pinned magnetic layer 3 are formed below the free magnetic layer 5, and the nonmagnetic material layer 6 and the pinned magnetic layer 7 are formed above the free magnetic layer 5, for detecting a recording magnetic field from the recording medium such as a hard disk or the like.

The magnetic detecting element shown in FIG. 28 is a CPP (current perpendicular to the plane) type magnetic detecting element in which an electric current flows in a direction perpendicular to the film plane of each of the layers of the multilayer film 9.

The magnetization direction of each of the pinned magnetic layers 3 and 7 is pinned in the Y direction shown in the drawing, and the magnetization direction of the free magnetic layer 5 with no external magnetic field applied thereto is oriented in the track width direction (the X direction shown in the drawing) in a single magnetic domain state by longitudinal bias magnetic fields from the hard bias layers 11. When the external magnetic field is applied, the magnetization direction of the free magnetic layer 5 changes to change the electric resistance of the multilayer film 9. The change in the electric resistance is converted to a voltage change or current change to detect the external magnetic field.

It is generally known that the CPP type magnetic detecting element cannot effectively produce high reproduction output unless the track width Tw and the length MRh in the height direction are 0.1 μm or less (i.e., the element area is 0.01 μm$^2$ or less), as compared with a CIP (current in the plane) type in which a sensing current flows in parallel to the film plane of each layer of the multilayer film).

Therefore, a construction is conceivable, in which as shown in FIG. 28, a current limiting layer 14 comprising a mixture of an insulating portion and a conductive portion is overlapped with the multilayer film 9, for flowing the sensing current only through the conductive portion to narrow the current.

The sensing current flowing from an electrode layer into the free magnetic layer 5 of the multilayer film 9 through the current limiting layer 14 locally flows through a portion of the free magnetic layer 5 corresponding to the conductive portion to locally increase the current density in this portion.

It is thus expected that the element area (referred to as an "effective element area") where the sensing current actually flows through the free magnetic layer 5 to contribute to a magnetoresistive effect can be made smaller than the element area of the free magnetic layer 5 (referred to as an "optical element area") in parallel to the film plane.

In the conventional magnetic detecting element shown in FIG. 28, the current limiting layer 14 is laminated above or below the antiferromagnetic layer 8 or 2.

The antiferromagnetic material such as PtMn used for forming the antiferromagnetic layers 2 and 8 has high resistance. Therefore, the mean free path of conduction electrons flowing through each of the antiferromagnetic layers 2 and 8 is short, and thus the conduction electrons in the narrow path diffuse due to inelastic scattering, thereby decreasing the effect of locally concentrating the current density by the current limiting layer 14. As a result, the problem of a difficulty in increasing ΔR of the magnetic detecting element occurs.

SUMMARY OF THE INVENTION

The present invention has been achieved for solving the above problem of a conventional magnetic detecting element, and an object of the present invention is to provide a magnetic detecting element capable of sufficiently exhibiting the effect of locally concentrating a current density by a current limiting layer to increase ΔR, and a method of manufacturing the magnetic detecting element.

A magnetic detecting element of the present invention comprises a multilayer film comprising a free magnetic layer, a nonmagnetic material layer, a pinned magnetic layer and an antiferromagnetic layer, which are laminated in turn, wherein a current flows perpendicularly to the film plane of each of the layers of the multilayer film, and the free magnetic layer comprises a plurality of magnetic layers which are laminated through a current limiting layer containing an insulating portion and a conductive portion.

In the present invention, the current limiting layer is formed in the free magnetic layer, and thus the density of a sensing current flowing through the free magnetic layer can be securely locally increased.

Therefore, in the present invention, even if the element area (referred to as an "optical element area) of the free magnetic layer in parallel to the film plane is 0.01 μm$^2$ or more, the element area (referred to as an "effective element area") in which the sensing current actually flows through the free magnetic layer to contribute to the magnetoresistive effect can be securely increased. Therefore, a CPP-type magnetic detecting element producing high ΔR and high reproduction output can be easily formed.

Also, the element area of the free magnetic layer can be increased to 0.01 µm² or more, and thus an external magnetic field from a recording medium can be effectively detected. Furthermore, reproduction output can be improved, and the stability of a reproduction waveform can be improved.

In another aspect of the present invention, a magnetic detecting element comprises a multilayer film comprising an upper nonmagnetic material layer, an upper pinned magnetic layer and an upper antiferromagnetic layer, which are laminated above a free magnetic layer, and a lower nonmagnetic material layer, a lower pinned magnetic layer and a lower antiferromagnetic layer, which are laminated below a free magnetic layer, wherein a current flows perpendicularly to the film plane of each of the layers of the multilayer film, and the free magnetic layer comprises a plurality of magnetic layers which are laminated through a current limiting layer containing an insulating portion and a conductive portion.

The magnetic detecting element having this construction is a so-called dual spin-valve magnetic detecting element which is suitable for improving the magnetic field detection output (reproduction sensitivity) of the CPP-type magnetic detecting element because the absolute value of the electric resistance is increased.

In the present invention, the current limiting layer is formed in the free magnetic layer, and thus the density of a sensing current flowing through the free magnetic layer can be securely locally increased.

Furthermore, hard bias layers are preferably formed on both sides of the free magnetic layer in the track width direction, for aligning magnetization of the free magnetic layer, or an in-stack bias layer or exchange coupling layer is preferably laminated above and/or below the free magnetic layer, for aligning magnetization of the free magnetic layer.

In the present invention, magnetizations of the plurality of magnetic layers are preferably parallel to each other. Particularly, the plurality of magnetic layers are preferably ferromagnetically coupled with each other through the current limiting layer.

The plurality of the magnetic layers are ferromagnetically coupled with each other by a method of bringing the magnetic layers in direct contact through pin holes, or the topological coupling method described below.

However, in the present invention, magnetizations of the plurality of the magnetic layers may be antiparallel to each other.

Also, the plurality of the magnetic layers constituting the free magnetic layer preferably have a same magnetic moment per unit area.

However, the plurality of the magnetic layers constituting the free magnetic layer may have different magnetic moments per unit area. Particularly, when magnetizations of the plurality of the magnetic layers are antiparallel to each other, the plurality of the magnetic layers having different magnetic moments per unit area are stabilized in terms of energy.

In the present invention, the plurality of the magnetic layers constituting the free magnetic layer preferably have a same thickness.

However, the plurality of the magnetic layers constituting the free magnetic layer may have different thicknesses. Particularly, when magnetizations of the plurality of the magnetic layers are antiparallel to each other, the plurality of the magnetic layers having different thicknesses are stabilized in terms of energy.

When magnetizations of the plurality (particularly, an odd number of 3 or more) of the magnetic layers are antiparallel to each other, and the free magnetic layer comprises a nonmagnetic intermediate layer made of at least one nonmagnetic material of Ru, Rh, Ir, Os, Re, Cr, and Cu, the magnetoresistive effect can be exhibited even when both pinned magnetic layers formed above and below the free magnetic layer have the same magnetization direction.

In still another aspect of the present invention, a magnetic detecting element comprises a multilayer film comprising a laminate of a free magnetic layer, a nonmagnetic material layer, a pinned magnetic layer and an antiferromagnetic layer, wherein a current flows perpendicularly to the film plane of each of the layers of the multilayer film, and a current limiting layer containing an insulating portion and a conductive portion is interposed between the free magnetic layer and the nonmagnetic material layer.

In the present invention, the current limiting layer is formed between the free magnetic layer and the nonmagnetic material layer, and thus the current density of a sensing current flowing through the free magnetic layer can be securely locally increased.

Therefore, in the present invention, even if the element area (referred to as an "optical element area") of the free magnetic layer in parallel to the film plane is 0.01 µm² or more, the element area (referred to as an "effective element area") in which the sensing current actually flows through the free magnetic layer to contribute to the magnetoresistive effect can be securely increased. Therefore, a CPP-type magnetic detecting element producing high ΔR and high reproduction output can be easily formed.

Also, the element area of the free magnetic layer can be increased to 0.01 µm² or more, and thus an external magnetic field from a recording medium can be effectively detected. Furthermore, reproduction output can be improved, and the stability of a reproduction waveform can be improved.

However, when the current limiting layer is formed between the free magnetic layer and the nonmagnetic material layer, scattering of spin-up conduction electrons moving in the free magnetic layer and the nonmagnetic material layer must be suppressed, and the spin direction of the conduction electrons must be kept constant so as not to cause spin flip.

In order to keep the spin direction of the conduction electrons constant, the contrast between an aperture and non-aperture of the current limiting layer is preferably increased, and the aperture is preferably absent from an excess impurity element. Alternatively, the current limiting layer is preferably made of a material that causes less spin flip of the conduction electrons.

In a further aspect of the present invention, a magnetic detecting element comprises a multilayer film comprising an upper nonmagnetic material layer, an upper pinned magnetic layer and an upper antiferromagnetic layer, which are laminated above a free magnetic layer, and a lower nonmagnetic material layer, a lower pinned magnetic layer and a lower antiferromagnetic layer, which are laminated below a free magnetic layer, wherein a current flows perpendicularly to the film plane of each of the layers of the multilayer film, and a current limiting layer containing an insulating portion and a conductive portion is interposed between the free magnetic layer and one of the nonmagnetic material layers.

In the present invention, the magnetic detecting element is a dual spin-valve magnetic detecting element in which the current limiting layer is formed between the free magnetic layer and one of the nonmagnetic material layers.

Also, a noble metal material layer is preferably formed at one or both of the top and bottom of the current limiting layer.

The noble metal material layer is made of, for example, at least one noble metal material of Ru, Pt, Au, Rh, Ir, Pd, Os and Re.

A Cu layer may be formed instead of the noble metal material layer.

In the present invention, the insulating portion of the current limiting layer comprises an insulating material film having a plurality of holes extending from the top to the bottom of the current limiting layer, the holes being preferably filled with a conductive material film serving as the conductive portion.

In the present invention, the insulating portion of the current limiting layer comprises an insulating material film having a groove continuously extending in a plan view parallel to the film plane, and the groove preferably extends from the top to the bottom of the current limiting layer and is filled with a conductive material serving as the conductive portion.

In the present invention, the insulating portion of the current limiting layer may comprise an insulating material film containing a hole extending from the top to the bottom of the current limiting layer and a groove which continuously extends in a plan view parallel to the film plane and extends from the top to the bottom of the current limiting layer. The hole and groove are preferably filled with a conductive material serving as the conductive portion.

In the present invention, the insulating material film comprises an oxide film or nitride film.

In the present invention, the conductive portion of the current limiting layer preferably comprises conductive particles which are dispersed in an insulating material layer serving as the insulating portion.

In the present invention, the insulating portion of the current limiting layer may comprise insulating particles which are dispersed in a conductive material film serving as the conductive portion.

In any case, the current limiting layer may comprise a mixture of the insulating portion and the conductive portion, and thus the effective element size can be appropriately decreased.

A method of manufacturing a magnetic detecting element of the present invention comprises the following steps:

(a) A step of laminating a first electrode layer, an antiferromagnetic layer, a pinned magnetic layer, a nonmagnetic material layer, a first magnetic layer constituting a free magnetic layer, and a current limiting layer containing an insulating portion and a conductive portion in order from below.

(b) A step of laminating a second magnetic layer constituting the free magnetic layer on the current limiting layer.

(c) A step of laminating a second electrode layer.

In the present invention, the first and second magnetic layers constituting the free magnetic layer are preferably ferromagnetically coupled with each other through the current limiting layer.

The first and second magnetic layers constituting the free magnetic layer preferably have a same magnetic moment per unit area.

However, the first and second magnetic layers constituting the free magnetic layer may have different magnetic moments per unit area.

In the present invention, the first and second magnetic layers constituting the free magnetic layer preferably have a same thickness. However, the first and second magnetic layers constituting the free magnetic layer may have different thicknesses.

The method may further comprise, between the steps (b) and (c), (d) a step of laminating a nonmagnetic material layer, a pinned magnetic layer and an antiferromagnetic layer on the free magnetic layer. In this case, a so-called dual spin-valve magnetic detecting element can be formed.

When the first and second magnetic layers are ferromagnetically coupled with each other, and the first and second magnetic layers have a same magnetic moment per unit area so that the magnetization directions of the first and second magnetic layers are parallel to each other, only one time of magnetic field annealing may be performed after the step (d) to form the dual spin-valve magnetic detecting element. Namely, even if the pinned magnetic layers formed above and below the free magnetic layer have the same magnetization direction, the magnetoresistive effect can be exhibited.

In forming the dual spin-valve magnetic detecting element in which the magnetization directions of the first and second magnetic layers are antiparallel to each other, a nonmagnetic intermediate layer comprising at least one nonmagnetic material of Ru, Rh, Ir, Os, Re, Cr and Cu is preferably formed in the first or second magnetic layer in the step (a) or (b).

In this construction, even if the magnetization directions of both pinned magnetic layers formed above and below the free magnetic layer are the same, the magnetoresistive effect can be exhibited, and thus only one time of magnetic field annealing may be performed after the step (d).

Another method of forming the dual spin-valve magnetic detecting element in which the magnetization directions of the first and second magnetic layers are antiparallel to each other comprises performing first magnetic filed annealing between the steps (a) and (b) or between the steps (b) and (d), and then performing second magnetic field annealing in a magnetic field of a strength different from that in the first magnetic field annealing and/or in a direction different from that in the first magnetic field annealing after the step (d).

A method of manufacturing a magnetic detecting element of the present invention comprises the following steps:

(e) A step of laminating a first electrode layer, an antiferromagnetic layer, a pinned magnetic layer, a nonmagnetic material layer, and a current limiting layer containing an insulating portion and a conductive portion in that order from below.

(f) A step of laminating a free magnetic layer on the current limiting layer.

(g) A step of laminating a second electrode layer.

This manufacturing method can form the magnetic detecting element comprising the current limiting layer provided between the nonmagnetic material layer and the free magnetic layer.

The method may further comprise, between the steps (f) and (g), (h) a step of laminating a nonmagnetic material layer, a pinned magnetic layer and an antiferromagnetic layer on the free magnetic layer. In this case, a so-called dual spin-valve magnetic detecting element comprising the current limiting layer provided between the free magnetic layer and one of the nonmagnetic material layers can be formed.

The step of forming the current limiting layer preferably comprises (a1) a step of depositing an insulating material film having a plurality of holes extending from the top to the bottom or a groove continuously extending as viewed from a plane parallel to the film plane, and (a2) a step of depositing a conductive material film on the insulating material film by sputtering to fill the holes or groove formed in the insulating material film with the conductive material film.

In the present invention, the conductive material film may be a second magnetic layer constituting the free magnetic layer.

The insulating material film is preferably formed in a discontinuous film. In this case, the plurality of holes extending from the top to the bottom of the current limiting layer or the groove can be easily formed. In order to form the insulating material film in a discontinuous film, the selection of a material and sputtering conditions are important. The sputtering conditions include a substrate temperature, an Ar gas pressure, a distance between the substrate and a target, and the like.

Alternatively, a target composed of an insulating material and a target composed of a conductive material are prepared, and then the two targets are simultaneously or alternately sputtered to form the current limiting layer containing particles of the insulating material and particles of the conductive material.

In the present invention, the current limiting layer is heat-treated to promote oxidation of easily oxidazable elements contained in the film, for controlling the ratio of an aperture (through which a current flows) of the current limiting layer. The ratio of the aperture is preferably about 10% to 30% of the whole layer.

Also, a noble metal material layer composed of a noble metal element or a Cu layer composed of Cu is preferably formed on the first magnetic layer or the free magnetic layer in the step (a), and then the current limiting layer is preferably formed on the noble metal material layer or the Cu layer.

Furthermore, a noble metal material layer composed of a noble metal element or a Cu layer composed of Cu is preferably formed on the current limiting layer after the current limiting layer is formed.

The noble metal material is, for example, at least one of Ru, Pt, Au, Rh, Ir, Pd, Os, and Re.

DESCRIPTION OF THE PREFERRED EMBODIMENTS

Figure 1:
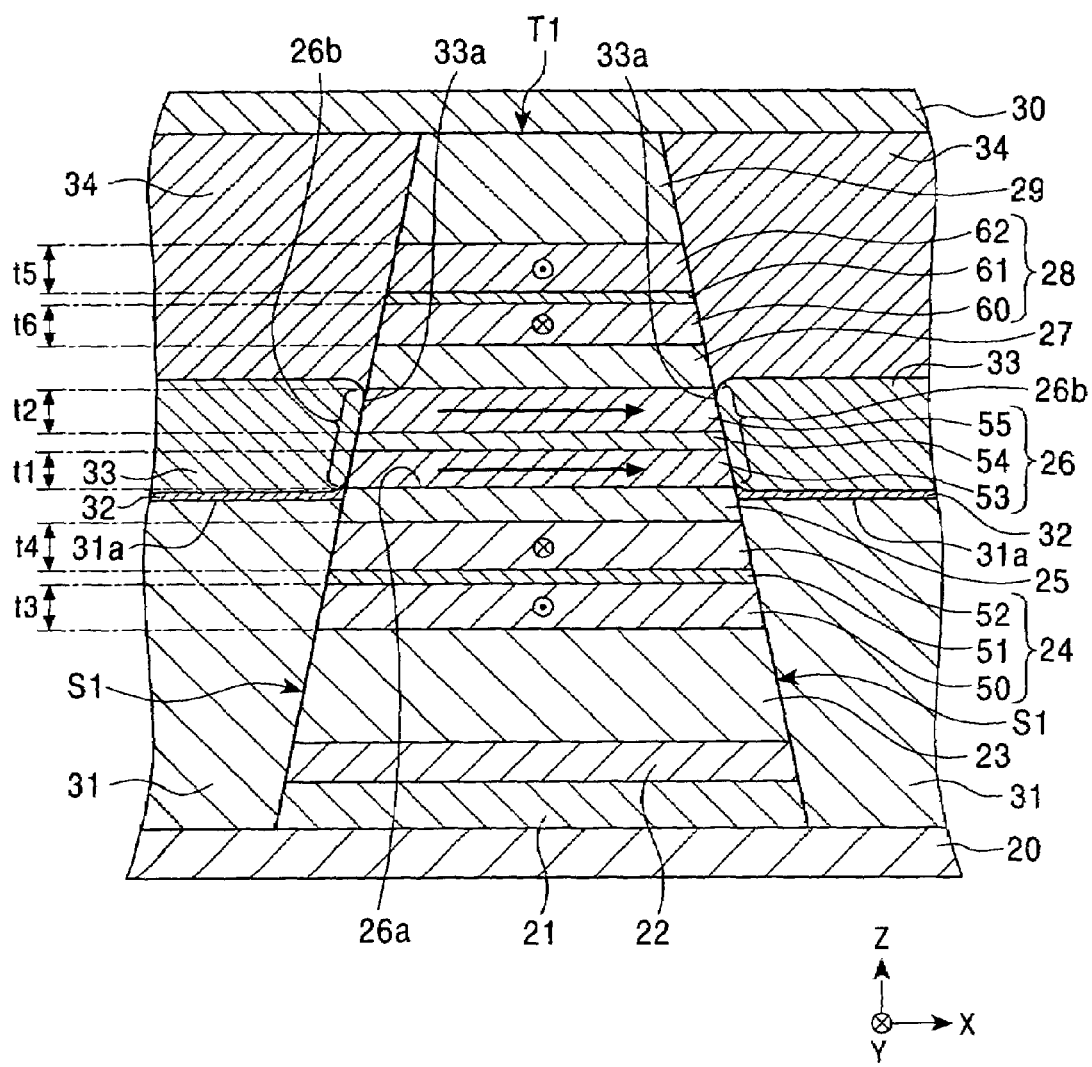
FIG. 1 is a sectional drawing of a magnetic detecting element according to a first embodiment of the present invention, as viewed from a side facing a recording medium.

FIG. 1 is a partial sectional view of the structure of a magnetic detecting element according to a first embodiment of the present invention, as viewed from a side facing a recording medium.

The magnetic detecting element shown in FIG. 1 is a so-called dual spin-valve thin film element.

As shown in FIG. 1, an underlying layer 21, a seed layer 22, an antiferromagnetic layer 23, a pinned magnetic layer 24 of a three-layer ferrimagnetic structure comprising magnetic layers 50 and 52 and an intermediate layer 51 formed therebetween and made of Ru or the like, a nonmagnetic material layer 25 and a free magnetic layer 26 are formed at the center of the top of a first electrode layer 20 in that order from below. Furthermore, a nonmagnetic material layer 27, a pinned magnetic layer 28 of a three-layer ferrimagnetic structure comprising magnetic layer 60 and 60 and an intermediate layer 61 formed therebetween and made of Ru or the like, an antiferromagnetic layer 29 and a second electrode layer 30 are laminated in turn on the free magnetic layer 26.

As shown in FIG. 1, insulating layers 31, bias underlying layers 32, hard bias layers 33 and insulating layers 34 are laminated in turn on both sides of a multilayer film T1 in the track width direction (the X direction shown in the drawing), the multilayer film T1 ranging from the underlying layer 21 to the antiferromagnetic layer 29.

The first electrode layer 20 is made of, for example, α-Ta, Au, Cr, Cu (copper), W (tungsten), or the like. The underlying layer 21 is preferably made of at least one of Ta, Hf, Nb, Zr, Ti, Mo, and W. The underlying layer 21 is formed to a thickness of about 50 Å or less. However, the underlying layer 21 need not be formed.

The seed layer 22 mainly comprises a face-centered cubic crystal which has a (111) plane preferentially oriented in parallel to the interface with the antiferromagnetic layer 23 described below. The seed layer 22 is preferably made of Cr, a NiFe alloy or a Ni—Fe—Y alloy (wherein Y is at least one selected from Cr, Rh, Ta, Hf, Nb, Zr, and Ti). When the seed layer 22 made of this material is formed on the underlying layer 21 made of Ta or the like, the (111) plane is easily preferentially oriented in parallel to the interface with the antiferromagnetic layer 23. The seed layer 22 is formed to a thickness of, for example, about 30 Å.

The magnetic detecting element of the present invention is a CPP type in which a sensing current flows perpendicularly to the film plane of each of the layers, and thus the sensing current must be caused to appropriately flow through the seed layer 22. Therefore, the seed layer 22 is preferably not made of a material having high resistivity. Namely, in the CPP type, the seed layer 22 is preferably made of a material having low resistivity, such as a NiFe alloy or the like. However, the seed layer 22 need not be formed.

Each of the antiferromagnetic layers 23 and 29 is preferably made of an antiferromagnetic material containing Mn and an element X (X is at least one element of Pt, Pd, Ir, Rh, Ru and Os), or Mn and elements X and X' (X' is at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and the rare earth elements).

These antiferromagnetic materials have excellent corrosion resistance and a high blocking temperature, and produce a large exchange anisotropic magnetic field at the interface with the pinned magnetic layer 24 or the pinned magnetic layer 28 which will be described below. Each of the antiferromagnetic layers 23 and 29 is preferably formed to a thickness of 80 Å to 300 Å, for example, 200 Å.

In this embodiment, each of the pinned magnetic layers 24 and 28 is formed in the three-layer ferrimagnetic structure.

The pinned magnetic layer 24 comprises the two magnetic layers 50 and 52 made of, for example, Co, CoFe, NiFe, CoFeNi, or the like. The intermediate layer 51 made of Ru or the like is interposed between the magnetic layers 50 and 52. In this structure, the magnetization directions of the magnetic layers 50 and 52 are antiparallel to each other. This is referred to as a co-called "synthetic ferrimagnetic structure". The pinned magnetic layer 28 also comprises the magnetic layers 60 and 62 made of, for example, Co, CoFe, NiFe, CoFeNi, or the like, and the intermediate layer 61 made of Ru or the like is interposed between the magnetic layers 60 and 62. The magnetization directions of the magnetic layers 60 and 62 are antiparallel to each other.

An exchange anisotropic magnetic field is produced between the antiferromagnetic layer 23 and the magnetic layer 50 and between the antiferromagnetic layer 29 and the magnetic layer 62.

For example, when magnetization of the magnetic layer 50 is pined in a direction opposite to the height direction (the Y direction shown in the drawing), the other magnetic layer 52 is magnetized and fixed in the height direction by a RKKY interaction. When magnetization of the magnetic layer 62 is pined in a direction opposite to the height direction, the other magnetic layer 60 is magnetized and fixed in the height direction by the RKKY interaction.

In this construction, magnetizations of the pinned magnetic layers 24 and 28 can be stabilized, and the magnetization directions of the magnetic layers 24 and 28 can be strongly pinned.

For example, each of the magnetic layers 50 and 52 and the magnetic layers 60 and 62 is formed to a thickness of about 10 Å to 70 Å. Each of the intermediate layers 51 and 61 is formed to a thickness of about 3 Å to 10 Å.

Each of the pinned magnetic layers 24 and 28 may be formed in a single layer film or laminated film comprising a NiFe alloy, a NiFeCo alloy, or a CoFe alloy instead of the ferrimagnetic structure.

The nonmagnetic material layers 25 and 27 are also formed. Each of the nonmagnetic material layers 25 and 27 is made of a conductive material having low electric resistance, for example, Cu, Cr, Au, Ag, or the like, and preferably Cu. Each of the nonmagnetic material layers 25 and 27 is formed to a thickness of, for example, about 25 Å.

As shown in FIG. 1, the insulating layers 31 are formed on the side regions of the first electrode layer 20 on both sides of the multilayer film T1 in the track width direction. Each of the insulating layers 31 is made of a general insulating material, for example, $Al_2O_3$, $SiO_2$, or the like.

The tops 31a of the insulating layers 31 are preferably lower (in a direction opposite to the Z direction) than the bottom 26a of the free magnetic layer 26.

Furthermore, the bias underlying layers 32 are formed on the insulating layers 31, and the hard bias layers 33 are formed on the bias underlying layers 32. The hard bias layers 33 are formed at positions facing the respective side surfaces 26b of the free magnetic layer 26. The hard bias layers 33 are magnetized in the track width direction (the X direction shown in the drawing), and magnetization of the free magnetic layer 26 (magnetizations of first and second magnetic layers 53 and 55) is aligned in the X direction by the longitudinal bias magnetic fields from the hard bias layers 33.

The bias underlying layers 32 are provided for improving the characteristics (coercive force Hc and remanence ratio S) of the hard bias layers 33.

In the present invention, each of the bias underlying layers 33 preferably comprises a metal film having a body centered cubic crystal structure (bcc structure). In a crystal orientation of the bias underlying layers 32, a (100) plane is preferentially oriented.

Each of the hard bias layers 33 is made of a CoPt alloy, a CoPtCr alloy, or the like. The crystal structure of this alloy comprises a single phase of a hexagonal close-packed structure (hcp) or a mixed phase of a face centered cubic structure (fcc) and a hexagonal close-packed structure (hcp).

The atomic arrangement of each bias underlying layer 32 comprising a metal film comes close to that of the hcp-structure CoPt-system alloy constituting each hard bias layer 33 at the interface therebetween, and thus the CoPt-system alloy has a difficulty in forming a fcc structure but is easily formed in a hcp structure. In this case, the c axis of the hcp structure is preferentially oriented within the boundary surface between the CoPt-system alloy and each of the bias underlying layers 32. Since the hcp structure produces large magnetic anisotropy in the c-axis direction as compared with the fcc structure, the coercive force He when a magnetic field is applied to the hard bias layers 33 increases. Furthermore, the c axis of the hcp structure is preferentially oriented within the boundary surface between the CoPt-system alloy and each of the bias underlying layers 32, and thus residual magnetization increases to increase the remanence ratio S determined by residual magnetization/saturation magnetic flux density. As a result, the characteristics of the hard bias layers 33 can be improved to increase a bias magnetic field produced from each of the hard bias layers 33. The metal film having a body-centered cubic crystal structure (bcc) is preferably composed of at least one element of Cr, W, Mo, V, Mn, Nb, and Ta.

Although the bias underlying layers 32 are preferably formed only below the hard bias layers 33, the bias underlying layer 32 may be slightly interposed between both side surfaces 26b of the free magnetic layer 26 and the hard bias layers 33. The thickness of each of the bias underlying layers 32 formed between both side surfaces 26b of the free magnetic layer 26 and the hard bias layers 33 in the track width direction (the X direction) is preferably 1 nm or less.

Therefore, the hard bias layers 33 can be magnetically connected to the free magnetic layer 26 without causing the problem of a buckling phenomenon in which the ends of the free magnetic layer 26 are influenced by a demagnetizing field, thereby facilitating the magnetic domain control of the free magnetic layer.

As shown in FIG. 1, the insulating layers 34 are furthermore formed on the respective hard bias layers 33. Each of the insulating layers 34 is made of a general insulating material such as $Al_2O_3$, $SiO_2$, or the like.

In this embodiment, the upper surfaces of the insulating layers 34 and the upper surface of antiferromagnetic layer 29 are formed in a continuous surface.

In this embodiment, a sensing current flows from the second electrode layer 30 to the first electrode layer 20. However, the sensing current may flow from the first electrode layer 20 to the second electrode layer 30. Therefore, the sensing current flows perpendicularly to the film plane of each layer of the magnetic detecting element. This flow direction of the sensing current is referred to as a "CPP type".

When the sensing current is supplied to the pinned magnetic layer 28, the nonmagnetic material layer 27, the free magnetic layer 26, the nonmagnetic material layer 25 and the pinned magnetic layer 24, and a leakage magnetic field in the Y direction is applied from a recording medium such as a hard disk or the like, which moves in the Z direction, magnetization (magnetizations of the first and second magnetic layers 53 and 55) of the free magnetic layer 26 changes from the X direction to the Y direction. As a result, the electric resistance changes according to the relation between the change in the magnetization direction of the free magnetic layer 26 and the pinned magnetization direction of each of the pinned magnetic layers 28 and 24 (magnetoresistive effect). Therefore, the leakage magnetic field from the recording medium is detected by a voltage change or current change based on the change in the electric resistance.

In the magnetic detecting element shown in FIG. 1, both side surfaces S1 of the multilayer film T1 in the track width direction (the X direction) are inclined continuous surfaces, the multilayer film T1 comprising the underlying layer 21, the seed layer 22, the antiferromagnetic layer 23, the pinned magnetic layer 24, the nonmagnetic material layer 25, the free magnetic layer 26, the nonmagnetic material layer 27, the pinned magnetic layer 28, and the antiferromagnetic layer 29.

The characteristics of the magnetic detecting element shown in FIG. 1 will be described below.

In this embodiment, the free magnetic layer 26 has the three-layer structure comprising the first magnetic layer 53, a current limiting layer 54 and the second magnetic layer 55.

The thickness of each of the first and second magnetic layers 53 and 55 is 10 Å to 100 Å, and the thickness of the current limiting layer 54 is 5 Å to 30 Å.

Each of the first and second magnetic layers 53 and 55 is made of a NiFe alloy, a CoFe alloy, Co, a CoNiFe alloy, or the like. In addition, an anti-diffusion Co film or CoFe film is preferably formed below the first magnetic layer 53 and above the second magnetic layer 55.

The current limiting layer 54 comprises a mixture of an insulating portion and a conductive portion, for locally increasing the current density of the sensing current flowing through the free magnetic layer 26.

The detailed structure of the current limiting layer 54 will be described below. The first and second magnetic layers 53 and 55 are preferably ferromagnetically coupled with each other through the current limiting layer 54 so that the magnetization directions of the first and second magnetic layers 53 and 55 are parallel to each other.

The first and second magnetic layers 53 and 55 are ferromagnetically coupled with each other by a method of bringing the first and second magnetic layers 53 and 55 into direction contact through a small hole or groove formed in the current limiting layer 54, or a topological coupling method.

Figure 2:
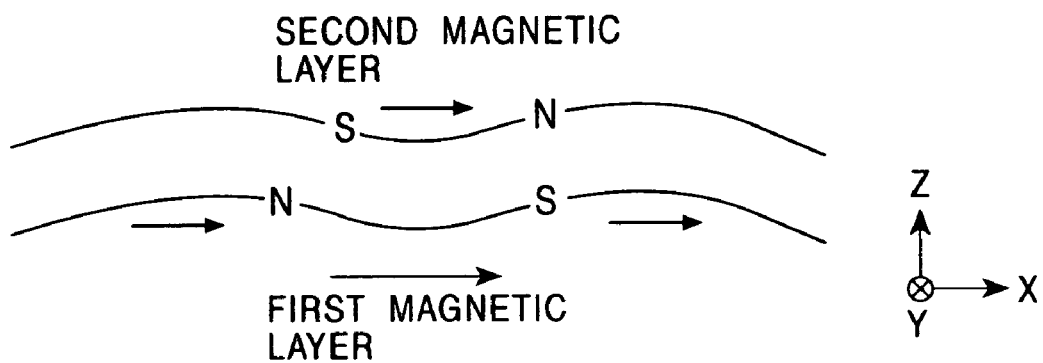
FIG. 2 is a schematic drawing showing a state of topological coupling between first and second magnetic layers of a free magnetic layer.

In the topological coupling method, as shown in FIG. 2, waviness occurs in each of the first and second magnetic layers 53 and 55 to produce surface magnetic charges on the surface of each of the first and second magnetic layers 53 and 55, thereby causing magnetostatic coupling (topological coupling) between the first and second magnetic layers 53 and 55.

When the first and second magnetic layers 53 and 55 have a same magnetic moment per unit area, the first and second magnetic layers 53 and 55 have the same rotation angle of magnetization with the external magnetic field even with weak coupling between the first and second magnetic layers 53 and 55, and thus the magnetization directions of the first and second magnetic layers 53 and 55 are easily oriented in parallel directions. When the first and second magnetic materials 53 and 55 are made of materials having a same composition, the magnetic moment per unit area of the first magnetic layer 53 can be equalized with that of the second magnetic layer 55 by equalizing the thickness t1 of the first magnetic layer 53 with the thickness t2 of the second magnetic layer 55.

However, in the magnetic detecting element shown in FIG. 1, the hard bias layers 33 are formed on both sides of the free magnetic layer 26 to apply a static magnetic field (longitudinal bias magnetic field) to both the first and second magnetic layers 53 and 55 in the track width direction (the X direction). With the large static magnetic fields applied from the hard bias layers 33, magnetizations of the first and second magnetic layers 53 and 55 can be oriented in parallel directions with the external magnetic field applied even when the first and second magnetic layers 53 and 55 are magnetically separated and the first and second magnetic layers 53 and 55 have different magnetic moments per unit area.

In the dual spin-valve thin film element having the structure shown in FIG. 1, when the magnetic layer 52 contributing to the magnetoresistive effect in the pinned magnetic layer 24 formed below the free magnetic layer 26 is pinned, for example, in the height direction (the Y direction), the magnetic layer 60 contributing to the magnetoresistive effect in the pinned magnetic layer 28 formed above the free magnetic layer 26 is also pinned in the height direction (the Y direction) so that the multilayer film T1 can exhibit the magnetoresistive effect.

In the magnetic detecting element shown in FIG. 1, the magnetic layers 50 and 52 of the pinned magnetic layer 24 are formed by using the same magnetic material composition, and the thickness t3 of the magnetic layer 50 is smaller than the thickness t4 of the magnetic layer 52. Also, the magnetic layers 60 and 62 of the pinned magnetic layer 28 are formed by using the same magnetic material composition, and the thickness t5 of the magnetic layer 62 is smaller than the thickness t6 of the magnetic layer 60.

Consequently, the magnetic moment per unit area of the magnetic layer 50<the magnetic moment per unit area of the magnetic layer 52, and the magnetic moment per unit area of the magnetic layer 62<the magnetic moment per unit area of the magnetic layer 60. In manufacturing the magnetic detecting element shown in FIG. 1, the magnetic layers 52 and 60 can be pinned in the height direction (the Y direction) by one time of magnetic field annealing.

The current limiting layer 54 formed between the first and second magnetic layers 53 and 55 of the free magnetic layer 26 will be described below.

Figure 3:
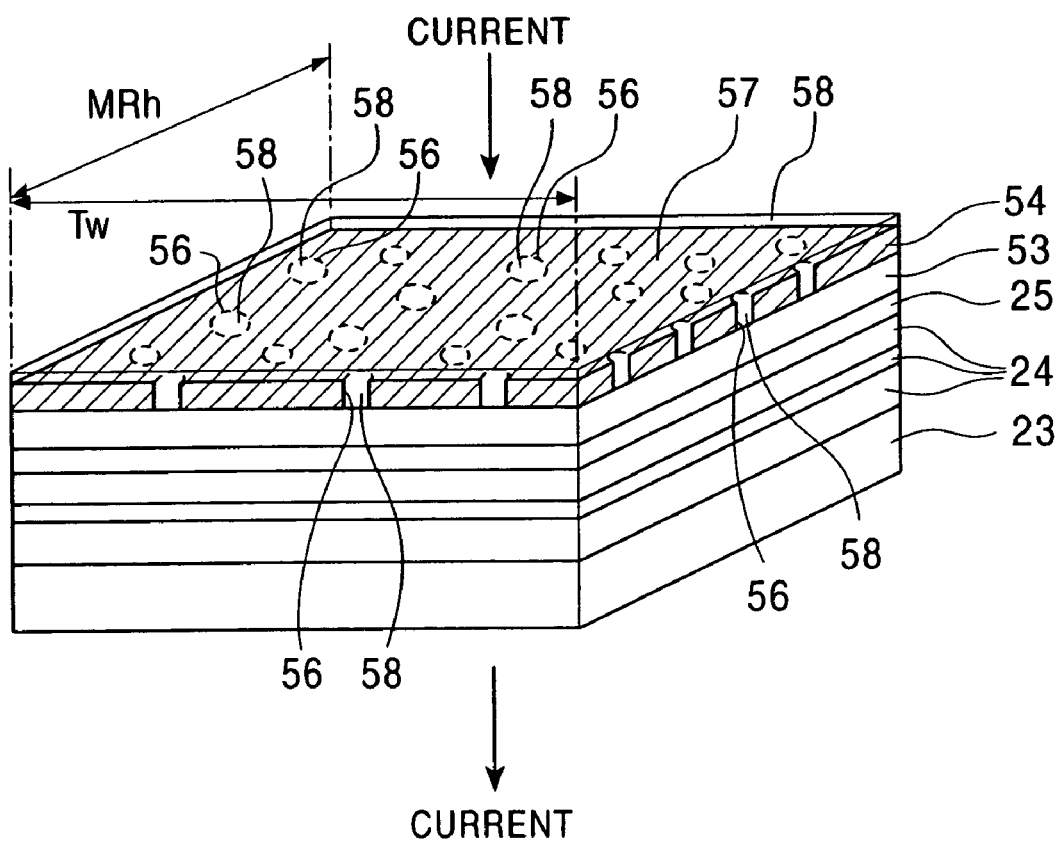
FIG. 3 is a partial schematic drawing showing a film structure comprising a multilayer film and a current limiting layer according to the present invention.

In the present invention, the current limiting layer 54 has, for example, the film structure shown in FIG. 3. FIG. 3 is a partial schematic drawing showing the antiferromagnetic layer 23, the pinned magnetic layer 24, the nonmagnetic material layer 25, the first magnetic layer 53 of the free magnetic layer 26, and the current limiting layer 54.

As shown in FIG. 3, the current limiting layer 54 comprises an insulating material film (insulating portion) 57 as a base material having a plurality of holes 56. At least some of the holes 56 extend from the top to the bottom of the insulating material film 57.

As shown in FIG. 3, a conductive material film (conductive portion) 58 is formed on the insulating material layer 57. The conductive material film 58 is also formed in the holes 56 formed in the insulating material film 57 so as to fill in the holes 56. FIG. 3 shows some of the holes 56 and the conductive material film 58 for the sake of simplification of the drawing.

The insulating material film 57 preferably comprises an oxide or nitride film. The oxide film preferably comprises an insulating material composed of at least one oxide of Ag, Cu, Zn, Ge, Pd, Al, Ti, Zr, Hf, Cr, Ta, V, Nb, Mo, W, Fe, Co, Si, Ni, and the rare earth elements. The nitride film preferably comprises an insulating material composed of at least one nitride of Ag, Cu, Zn, Ge, Pd, Al, Ti, Zr, Hf, Cr, Ta, V, Nb, Mo, W, Fe, Co, Si, Ni, and the rare earth elements.

When the oxide film or nitride film is thinly deposited, the film easily becomes a discontinuous film due to aggregation in sputtering deposition. In the insulating material film 57 comprising the discontinuous film, the holes 56 extending from the top to the bottom are easily formed, as shown in FIG. 3.

In order to form the discontinuous film, it is important to appropriately select sputtering conditions as well as the material. The sputtering conditions for forming the insulating material film 57 comprising the discontinuous film include a substrate temperature of as low as about 20° C. to 200° C., an Ar gas pressure of as high as 10 mTorr to 50 mTorr (1.3 Pa to 6.7 Pa), and a substrate-target distance of about 200 nm to 300 nm, etc.

For the sputtering deposition, for example, any one of a RF sputtering process, a RF magnetron sputtering process, a DC magnetron sputtering process, an ion beam sputtering process, a long slow sputtering process, and a collimation sputtering process, or a combination thereof can be used.

The conductive material film 58 can be formed by using a general conductive material. For example, α-Ta, Au, Cr, Cu (copper) or W (tungsten) can be used. The conductive material film 58 may be made of at least one noble metal element of Ru, Pt, Au, Rh, Ir, Pd, Os and Re, and Cu may be added to the noble metal.

The noble metal element is less oxidized, and thus the conductive material film 58 made of the noble metal element is formed on the insulating material film 57 and in the holes 56 to suppress oxygen diffusion in heat treatment, thereby maintaining a high contrast between an aperture (hole or groove) and a non-aperture (insulating material layer). The second magnetic layer 55 of the free magnetic layer 26 may be also used as the conductive material film 58 of the current limiting layer 54.

As described above, when the current limiting layer 54 comprising a mixture of the insulating portion and the conductive portion is provided on the first magnetic layer 53, the following effect can be expected.

In the CPP-type magnetic detecting element, the sensing current form the second electrode layer 30 flows through the current limiting layer 54 perpendicularly to the film plane. However, in the structure of the current limiting layer 54 of the present invention in which the holes 56 formed in the insulating material film (insulating portion) 57 are filled with the conductive material film (conductive portion) 58, the sensing current flows only through the conductive material film 58 (or only through the holes 56 formed in the insulating material film (insulating portion) 57).

Therefore, the current density of the sensing current flowing through the free magnetic layer 26 is locally increased.

Therefore, even if the element area (referred to as the "optical area") of the free magnetic layer 26 in parallel to the film plane is increased, the element area (referred to as the "effective element area") in which the sensing current actually flows through the free magnetic layer 26 to contribute to the magnetoresistive effect can be decreased. Thus, the CPP-type magnetic detecting element having a large optical element size and producing high reproduction output can easily be formed.

Figure 4:
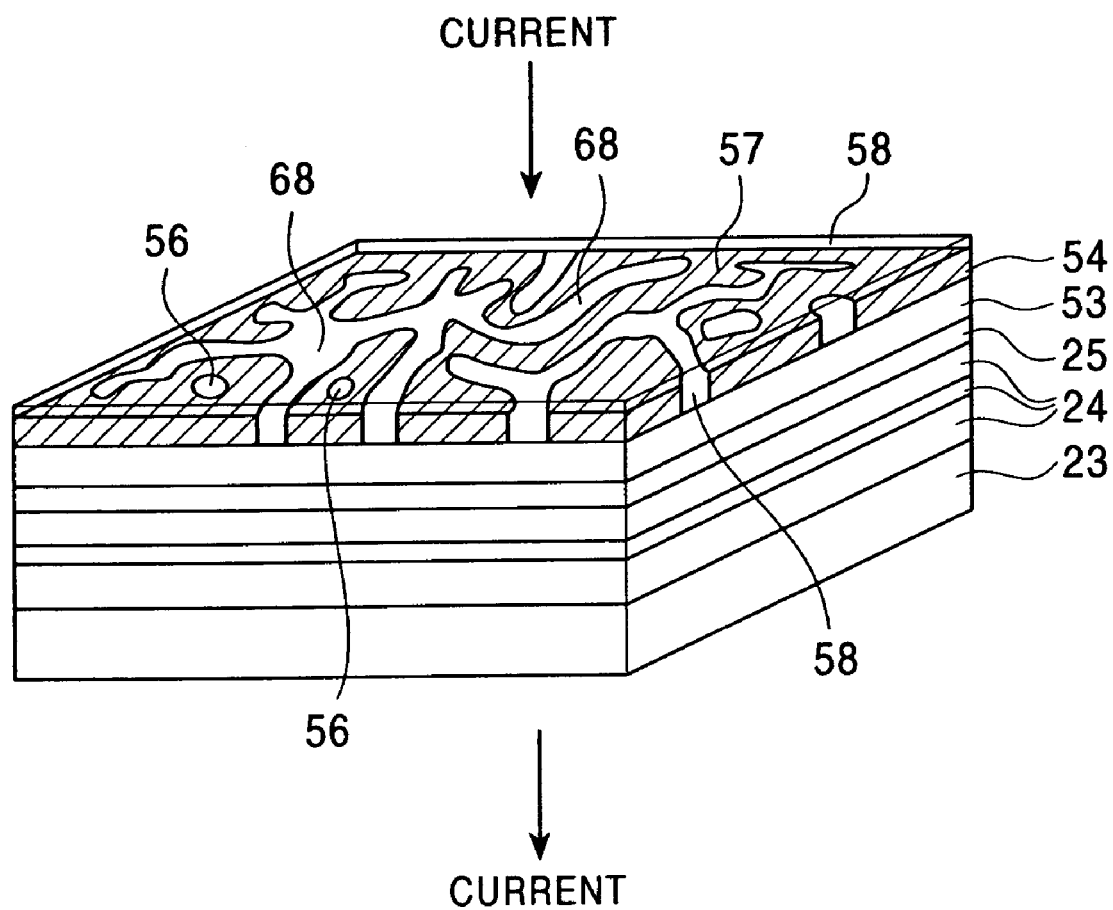
FIG. 4 is a partial schematic drawing showing a film structure comprising a multilayer film and another current limiting layer according to the present invention.

More specifically, the track width Tw shown in FIGS. 3 and 4 can be set to, for example, 0.15 μm to 0.3 82 m, and the length MRh in the height direction can be set to, for example, 0.15 μm to 0.3 82 m, thereby increasing the optical element area to 0.02 to 0.09 μm².

In the present invention, the effective element area is preferably 0.01 μm² or less. The effective element area can be determined by, for example, multiplying the optical element area (Tw×MRh) by the opening ratio of the holes 56. This can be roughly determined by a difference between the resistance of a GMR single film and the resistance of the whole element including electrodes.

In a plan view of the current limiting layer 54 in parallel to the film plane, the opening ratio (the holes 56) is preferably about 10% to 30%.

In the present invention, the optical element area can be increased, and thus the external magnetic field from the recording medium can be effectively detected by the magnetic detecting element. Therefore, the CPP-type magnetic detecting element having high sensitivity and excellent reproduction properties can be manufactured.

In the present invention, the film structure of the current limiting layer 54 is not limited to the structure shown in FIG. 3, and for example, the film structure shown in FIG. 4 can be used.

In the current limiting layer 54 shown in FIG. 4, the insulating material film 57 has grooves 68 which continuously extend in a plan view of the current limiting layer 54 in parallel to the film plane, the grooves 68 extending from the top to the bottom of the current limiting layer 54. The grooves 68 may have any one of a long curved planar shape and branched planar shape. Furthermore, the conductive material film 58 is formed in the grooves 68 and on the insulating material film 57. A difference between the shape of the insulating material film 57 shown in FIG. 4 and the shape shown in FIG. 3 is due to a difference in nuclear growth of a thin film. A thin film (the insulating material film 57 or a base layer for the insulating material film 57) is first grown into islands on the first magnetic layer 53 of the free magnetic layer 26, and then the islands adhere to each other by further growth to form the grooves 68 continuously extending, as shown in FIG. 4.

Namely, the planar shape of the current limiting layer 54 depends upon the time when the growth of the thin film is stopped. In this case, it is important to appropriately form the holes 56 or grooves 68 extending from the bottom to the top of the insulating material film 58 which constitutes the current limiting layer 54. When such through holes 56 or grooves 68 are formed, the conductive material film 58 filling in each of the holes 56 or grooves 68 serves as a flow path of the current, thereby appropriately narrowing the current path.

As shown in FIG. 4, the insulating material film 57 of the current limiting layer 54 may comprise a mixture of the holes 56 extending from the top to the bottom of the current limiting layer 54 and the grooves 68 extending from the top to the bottom of the current limiting layer 54 and continuously extending in a plan view in parallel to the film plane.

The second magnetic layer 55 of the free magnetic layer 26 may be laminated directly on the insulating material film 57 to be buried in the holes 56 or grooves 68 formed in the insulating material film 57 instead of the insulating material film 58 comprising an independent layer. When the second magnetic layer 55 is buried in the holes 56 or groove 68 formed in the insulating material film 57, the first and second magnetic layers 53 and 55 are put into direct contact to be ferromagnetically coupled with each other. As a result, the magnetization directions of the first and second magnetic layers 53 and 55 are oriented in parallel directions.

Each of the current limiting layers 54 shown in FIGS. 3 and 4 comprises the insulating material film 57 having a plurality of the holes 56 or grooves 68, and the insulating material film 58 filling in the holes 56 or grooves 68. However, the current limiting layer 54 may have the following film structure.

For example, a target of an insulating material, a target of a conductive material are prepared, and the two targets are simultaneously sputtered to form the current limiting layer 54 comprising a mixture of insulating material particles and conductive material particles on the first magnetic layer 53 of the free magnetic layer 26.

Specifically, a film structure can be provided, in which the conductive portion of the current limiting layer 54 comprises conductive particles which are dispersed in the insulating material film serving as the insulating portion.

An example of the current limiting layer 54 having the above film structure is a film structure in which micro crystal grains constituting the conductive portion mainly composed of Fe are dispersed in an amorphous material constituting the insulating portion and containing an O or N compound with at least one element M selected from Ti, Zr, Hf, Nb, Ta, Mo, W and the rare earth elements.

The current limiting layer 54 has a composition represented by the formula $Fe_aM_bO_c$ wherein composition ratios a, b and c by atomic % preferably satisfy the relationships $40 \leq a \leq 50$, $10 \leq b \leq 30$, $20 \leq c \leq 40$, and $a+b+c=100$.

Alternatively, the current limiting layer 54 has a composition represented by the formula $Fe_dM_eN_f$ wherein composition ratios d, e and f by atomic % preferably satisfy the relationships $60 \leq d \leq 70$, $10 \leq e \leq 15$, $19 \leq f \leq 25$, and $d+e+f=100$.

The current limiting layer 54 may be formed by sputtering two targets, for example, a Fe target and a $HfO_2$ target. In this case, the current limiting layer 54 comprising many micro crystal grains mainly composed of bcc Fe and precipitating in an amorphous phase matrix can be formed.

For the sputtering deposition, for example, any one of a RF sputtering process, a RF magnetron sputtering process, a DC magnetron sputtering process, an ion beam sputtering process, a long slow sputtering process, and a collimation sputtering process, or a combination thereof can be used.

The present invention can form the current limiting layer 54 in which the insulating material film constituting the current limiting layer 54 mainly comprises a Co oxide layer, and conductive particles composed of at least one noble metal material of Ru, Pt, Au, Rh, Ir, Pd, Os, Re, Cu and Ag are dispersed in the insulating material film.

The current limiting layer 54 may have a film structure in which the insulating portion comprises insulating particles dispersed in the conductive material film serving as the conductive portion.

A general conductive material such as Cu can be used for the conductive particles, and a general insulating material such as $Al_2O_3$ can be used for the insulating particles.

As described above, when the current limiting layer 54 comprising a so-called granular film containing the conductive particles is formed, the conductive particles do not appropriately function as a current path of the sensing current unless the thickness of the current limiting layer 54 is smaller than the particle size of the conductive particles. Thus, the reproduction characteristics such as reproduction output deteriorate.

In the magnetic detecting element shown in FIG. 1, the current limiting layer 54 is formed in the free magnetic layer 26, and thus the current density of the sensing current flowing through the free magnetic layer 26 can be securely locally increased.

Therefore, even if the element area (the optical area) of the free magnetic layer 26 in parallel to the film plane is increased to 0.01 $\mu m^2$ or more, the element area (the effective element area) in which the sensing current actually flows through the free magnetic layer 26 to contribute to the magnetoresistive effect can be securely decreased. Thus, a CPP-type magnetic detecting element producing large $\Delta R$ and high reproduction output can easily be formed.

Since the element area of the free magnetic layer can be increased 0.01 $\mu m^2$ or more, the external magnetic field from the recording medium can be effectively detected by the magnetic detecting element, and reproduction output and stability of a reproduction waveform can be improved.

The dual spin-valve magnetic detecting element shown in FIG. 1 is suitable for improving the magnetic field detection output (reproduction sensitivity) of the CPP-type magnetic detecting element because the absolute value of the electric resistance is increased.

Figure 5:
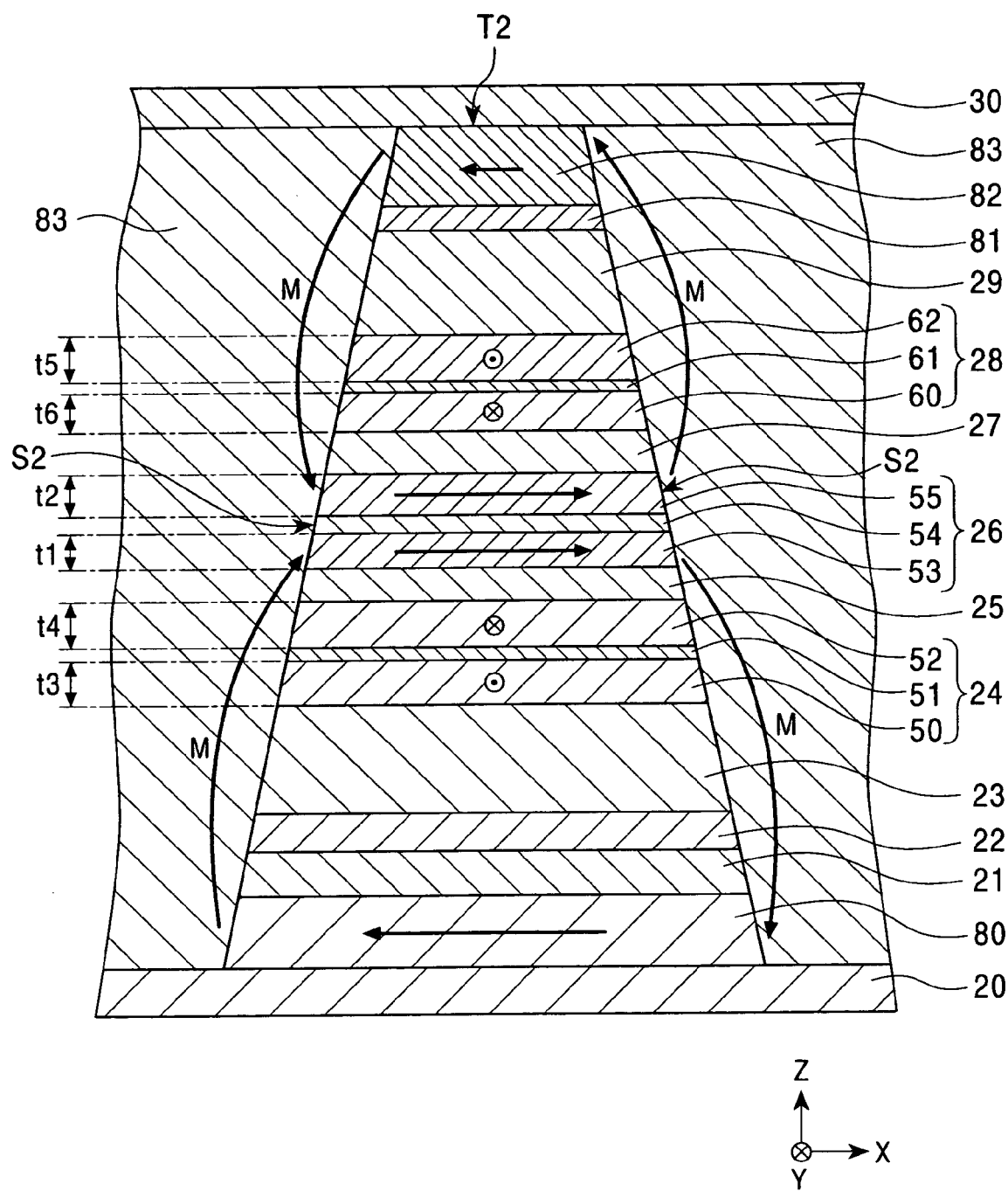
FIG. 5 is a sectional drawing of a magnetic detecting element according to a second embodiment of the present invention, as viewed from a side facing a recording medium.

FIG. 5 is a partial sectional view showing the structure of a magnetic detecting element according to a second embodiment of the present invention, as viewed from the side facing the recording medium.

The magnetic detecting element shown in FIG. 5 is also a so-called dual spin-valve thin film element. Like in the magnetic detecting element shown in FIG. 1, a first electrode layer 20, an underlying layer 21, a seed layer 22, an antiferromagnetic layer 23, a pinned magnetic layer 24 comprising magnetic layers 50 and 52 and an intermediate layer 51, a nonmagnetic material layer 25, a free magnetic layer 26, a nonmagnetic material layer 27, a pinned magnetic layer 28 of a three-layer ferrimagnetic structure comprising magnetic layers 60 and 62 and an intermediate layer 61, an antiferromagnetic layer 29 and a second electrode layer 30 are laminated in turn. The same reference numerals as those in FIG. 1 denote the same layers as those in FIG. 1.

In the magnetic detecting element shown in FIG. 5, a system for applying a longitudinal bias to the free magnetic layer 26 is different from that in the magnetic detecting element shown in FIG. 1.

In the magnetic detecting element shown in FIG. 5, an in-stack bias layer 80 is formed between the first electrode layer 20 and the underlying layer 21, and an in-stack bias layer 82 is further formed on the upper antiferromagnetic layer 29 with an intermediate layer 81 provided therebetween, instead of the hard bias layers formed on both sides of the free magnetic layer 26. A multilayer film T2 comprises a laminate from the in-stack bias layer 80 to the in-stack bias layer 82.

Each of the in-stack bias layers 80 and 82 is made of a hard magnetic material such as CoPt or the like, and is magnetized in a direction antiparallel to the X direction. Also, an underlying layer made of Cr, W, or the like may be formed between the in-stack bias layer 80 and the first electrode layer 20 and between the in-stack bias layer 82 and the intermediate layer 81.

In this embodiment, a longitudinal bias magnetic field (static magnetic field) is supplied (shown by an arrow M) to the free magnetic layer 26 from both side ends of each of the in-stack bias layers 80 and 82, so that magnetization (magnetizations of the first and second magnetic layers 53 and 55) of the free magnetic layer 26 is oriented in the X direction shown in the drawing.

The intermediate layer 81 is preferably made of a nonmagnetic conductive material. Specifically, the intermediate layer 81 is preferably made of at least one of Ru, Rh, Ir, Cr, Re, Cu, and Ta, or an alloy of at least two of these elements.

The intermediate layer 81 may be made of an insulating material, for example, $Al_2O_3$, $SiO_2$, or the like. In this case, the intermediate layer 81 must be thinly formed so as not to cut off the sensing current flowing between the first and second electrode layers 20 and 30 by the intermediate layer 80. The thickness of the intermediate layer 81 is preferably 20 Å to 100 Å.

As shown in FIG. 5, in the structure comprising the in-stack bias layers 80 and 82, the free magnetic layer 26 is not strongly magnetized to optimize the magnetic domain control of the free magnetic layer 26 in comparison to a case in which the hard bias layers are formed, thereby facilitating a change in magnetization of the free magnetic layer 26 with the external magnetic field.

In the embodiment shown in FIG. 5, insulating layers 83 each composed of alumina or $SiO_2$ are formed on both sides of the side end surfaces S2 of the multilayer film T2 ranging from the in-stack bias layer 80 to the in-stack bias layer 82. It is thus possible to decrease a shunt loss of the sensing current flowing between the first and second electrode layers 20 and 30.

Like in the magnetic detecting element shown in FIG. 1, in the magnetic detecting element shown in FIG. 5, the first and second magnetic layers 53 and 55 are preferably ferromagnetically coupled with each other through the current limiting layer 54 so that the magnetization directions of the first and second magnetic layers 53 and 55 are oriented in parallel directions.

Particularly, even when ferromagnetic coupling between the first and second magnetic layers 53 and 55 is weak, in order to orient the magnetization directions of the first and second magnetic layers 53 and 55 in parallel directions, the magnetic moment per unit area of the first magnetic layer 53 is preferably equalized with that of the second magnetic layer 55 by equalizing the material and thickness of the first magnetic layer 53 with those of the second magnetic layer 55.

However, even if the first and second magnetic layers 53 and 55 are magnetically separated, the magnetization directions of the first and second magnetic layers 53 and 55 can be oriented in parallel directions as long as the sufficient static magnetic field is applied from each of the in-stack bias layers 80 and 82.

In the magnetic detecting element shown in FIG. 5, the two in-stack bias layers 80 and 82 are formed for orienting the magnetization directions of the first and second magnetic layers 53 and 55 in parallel directions. However, only one of the in-stack bias layers 80 and 82 may be formed for supplying a longitudinal bias magnetic field to the first and second magnetic layers 53 and 55.

Like in the magnetic detecting element shown in FIG. 1, in the pinned magnetic layer 24, the magnetic layer 52 contributing to the magnetoresistive effect is pinned in, for example, the height direction (the Y direction), and in the pinned magnetic layer 28 formed above the free magnetic layer 26, the magnetic layer 60 contributing to the magnetoresistive effect is also pinned in the height direction (the Y direction). To this end, the magnetic layers 50 and 52 of the pinned magnetic layer 24 are made of magnetic materials having the same composition, and the thickness t3 of the magnetic layer 50 is smaller than the thickness of t4 of the magnetic layer 52. Also, the magnetic layers 60 and 62 of the pinned magnetic layer 28 are made of magnetic materials having the same composition, and the thickness t5 of the magnetic layer 62 is smaller than the thickness t6 of the magnetic layer 60.

The magnetic detecting element shown in FIG. 5 comprises the current limiting layer 54 formed in the free magnetic layer 26, and can thus exhibit the same effect as the magnetic detecting element shown in FIG. 1.

Figure 6:
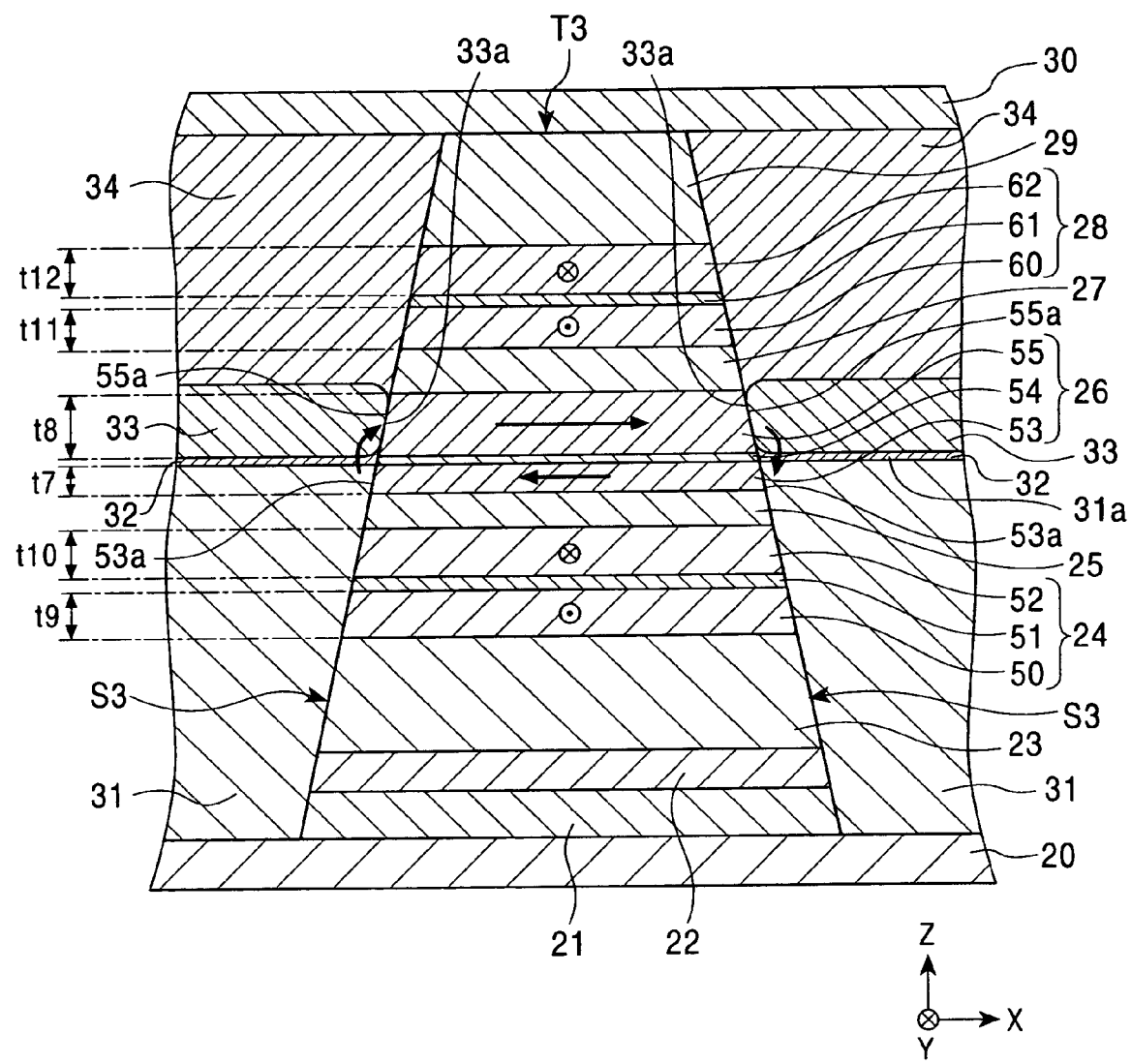
FIG. 6 is a sectional drawing of a magnetic detecting element according to a third embodiment of the present invention, as viewed from a side facing a recording medium.

FIG. 6 is a partial sectional drawing showing the structure of a magnetic detecting element according to a third embodiment of the present invention, as viewed from a side facing a recording medium.

The magnetic detecting element shown in FIG. 6 is similar to the magnetic detecting element shown in FIG. 1. The magnetic detecting element shown in FIG. 6 is different from the magnetic detecting element shown in FIG. 1 in that the magnetization directions of first and second magnetic layer 53 and 55 of a free magnetic layer 26 are oriented in antiparallel directions.

In FIG. 6, the same reference numerals as those in FIG. 1 denote the same layers each made of the same material having the same thickness as in FIG. 1 unless otherwise specified.

In the magnetic detecting element shown in FIG. 6, ferromagnetic coupling between the first and second magnetic layers 53 and 55 of the free magnetic layer 26 is weakened. Namely, the first and second magnetic layers 53 and 55 are out of direct contact, and small waviness occurs on the surface of each of the first and second magnetic layers 53 and 55 to cause less topological coupling.

With the weak ferromagnetic coupling between the first and second magnetic layers 53 and 55 of the free magnetic layer 26, the magnetization directions of the first and second magnetic layers 53 and 55 are antiparallel to each other, and the first and second magnetic layers 53 and 55 are stabilized in terms of energy by magnetostatic coupling between the ends 53a and the ends 55a thereof.

Like in the magnetic detecting element shown in FIG. 1, in the magnetic detecting element shown in FIG. 6, the first and second magnetic layers 53 and 55 of the free magnetic layer 26 are made of the same material, but the first and second magnetic layers 53 and 55 have different thicknesses t7 and t8, respectively. Therefore, the first and second magnetic layers 53 and 55 have different magnetic moments per unit area, and thus the antiparallel state of magnetizations of the first and second magnetic layer 53 and 55 is more stabilized.

In the magnetic detecting element shown in FIG. 6, the thickness t7 of the first magnetic layer 53 is, for example, 10 Å to 70 Å, and the thickness t8 of the second magnetic layer 55 is, for example, 20 Å to 100 Å.

In the magnetic detecting element shown in FIG. 6, the first and second magnetic layers 53 and 55 of the free magnetic layer 26 are put into a single magnetic domain state by the hard bias layers 33. However, in this embodiment in which the magnetizations of the first and second magnetic layers 53 and 55 are oriented in antiparallel directions, the inner end surfaces 33a of the hard bias layers 33 preferably face only the ends of one of the first and second magnetic layers 53 and 55. In FIG. 6, the inner end surfaces 33a of the hard bias layers 33 face only the ends 55a of the second magnetic layer 55. Therefore, a longitudinal bias magnetic field supplied from the hard bias layers 33 in the track width direction (the X direction) acts directly only on the second magnetic layer 55, thereby suppressing or preventing the occurrence of disturbance in magnetization of the first magnetic layer 53 having the magnetization direction antiparallel to the track width direction.

Also, in the magnetic detecting element shown in FIG. 6 in which the magnetization directions of the first and second magnetic layers 53 and 55 are antiparallel to each other, a multilayer film T3 ranging from the underlying layer 21 to the antiferromagnetic layer 29 is enabled to exhibit the magnetoresistive effect. To this end, when the magnetic layer 52 contributing to the magnetoresistive effect in the pinned magnetic layer 24 formed below the free magnetic layer 26 is pinned in, for example, the height direction (the Y direction), the magnetic layer 60 contributing to the magnetoresistive effect in the pinned magnetic layer 28 formed above the free magnetic layer 26 must be pinned in a direction antiparallel to the height direction (the Y direction).

When the magnetization directions of the magnetic layers 52 and 60 are parallel to each other, the magnetoresistive effect produced between the second magnetic layer 55 of the free magnetic layer 26 and the magnetic layer 60 of the pinned magnetic layer 28 is canceled by the magnetoresistive effect produced between the first magnetic layer 53 of the free magnetic layer 26 and the magnetic layer 52 of the pinned magnetic layer 24 to fail to detect the external magnetic field.

In the magnetic detecting element shown in FIG. 6, the magnetic layers 50 and 52 of the pinned magnetic layer 24 are made of magnetic materials having the same composition, and the thickness t9 of the magnetic layer 50 is smaller than the thickness t10 of the magnetic layer 52 (t9<t10). Also, the magnetic layers 60 and 62 of the pinned magnetic layer 28 are made of magnetic materials having the same composition, and the thickness t12 of the magnetic layer 62 is larger than the thickness t11 of the magnetic layer 60 (t12>t11).

Therefore, the magnetic moment per unit area of the magnetic layer 50<the magnetic moment per unit area of the magnetic layer 52, and the magnetic moment per unit area of the magnetic layer 62>the magnetic moment per unit area of the magnetic layer 60. In manufacturing the magnetic detecting element shown in FIG. 6, the magnetization directions of the magnetic layers 52 and 60 can be made antiparallel to each other by only one time of magnetic field annealing in a magnetic field lower than a spin flop magnetic field.

Even when the thickness t9 of the magnetic layer 50 is larger than the thickness t10 of the magnetic layer 52 (t9>t10), and the thickness t12 of the magnetic layer 62 is smaller than the thickness t11 of the magnetic layer 60 (t12<t11), the magnetization directions of the magnetic layers 52 and 60 can be made antiparallel to each other by only one time of magnetic field annealing.

As another method for making the magnetization directions of the magnetic layer 52 of the pinned magnetic layer 24 and the magnetic layer 60 of the pinned magnetic layer 28 antiparallel to each other, the following manufacturing method can be used.

First, the underlying layer 21, the seed layer 22, the antiferromagnetic layer 23, the pinned magnetic layer 24, the nonmagnetic material layer 25, and the first magnetic layer 53 and the current limiting layer 54 of the free magnetic layer 26 are deposited on the first electrode layer 20. Then, first magnetic field annealing is performed in a magnetic field, for example, in the height direction. Next, the second magnetic layer 55 of the free magnetic layer 26, the nonmagnetic material layer 27, the pinned magnetic layer 28 and the antiferromagnetic layer 29 are deposited on the current limiting layer 54. Then, second magnetic field annealing is performed in a magnetic field in a direction antiparallel to the direction of the magnetic field applied in the first magnetic field annealing.

When the first magnetic field annealing is performed in a magnetic field larger than the saturation magnetic field of the pinned magnetic layer 24 with the magnetic layer 62 having the thickness t12 smaller than the thickness t11 of the magnetic layer 60 (t12<t11), the second magnetic field annealing is performed in a magnetic field weaker than the spin flop magnetic field of the pinned magnetic layers 24 and 28 in the same direction as the magnetic field applied in the first magnetic field annealing.

In the method comprising two times of magnetic field annealing, the magnetic layers 50 and 52 of the pinned magnetic layer 24 may be made of magnetic materials having the same composition, and the thickness t9 of the magnetic layer 50 may be not less than the thickness t10 of the magnetic layer 52 (t9≧t10). Also, the magnetic layers 60 and 62 of the pinned magnetic layer 28 may be made of magnetic materials having the same composition, and the thickness t12 of the magnetic layer 62 may be not less than the thickness t11 of the magnetic layer 60 (t12≧t11). In this case, the magnetization directions of the magnetic layer 52 of the pinned magnetic layer 24 and the magnetic layer 60 of the pinned magnetic layer 28 can be mage antiparallel to each other. This is true for a case in which the thickness t9 of the magnetic layer 50 is not more than the thickness t10 of the magnetic layer 52 (t9≦t10), and the thickness t12 of the magnetic layer 62 is not more than the thickness t11 of the magnetic layer 60 (t12≦t11).

When t9≧t10 and t12≧t11, or t9≦t10 and t12≦t11, the magnitude of a one-direction anisotropic magnetic field Hex* between the lower antiferromagnetic layer 23 and the pinned magnetic layer 24 can be easily set to substantially the same value as that between the upper antiferromagnetic layer 29 and the pinned magnetic layer 28.

The magnetic detecting element shown in FIG. 6 comprises the current limiting layer 54 formed in the free magnetic layer 26, and can thus exhibit the same effect as the magnetic detecting element shown in FIG. 1.

Figure 7:
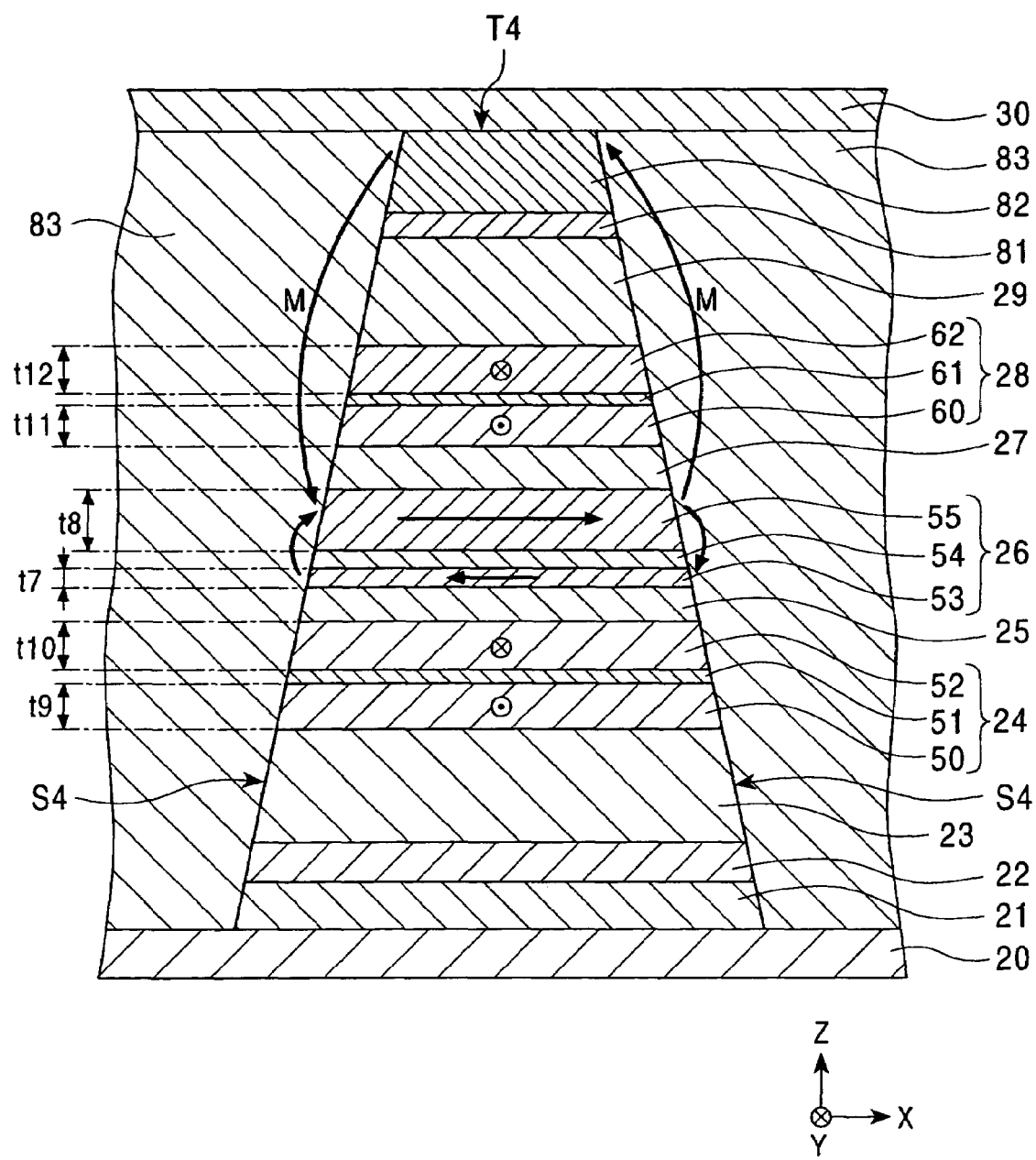
FIG. 7 is a sectional drawing of a magnetic detecting element according to a fourth embodiment of the present invention, as viewed from a side facing a recording medium.

FIG. 7 is a partial sectional view of the structure of a magnetic detecting element according to a fourth embodiment of the present invention, as viewed from a side facing a recording medium.

The magnetic detecting element shown in FIG. 7 is similar to the magnetic detecting element shown in FIG. 6. The magnetic detecting element shown in FIG. 7 is different from the magnetic detecting element shown in FIG. 6 in a system for applying a longitudinal bias to a free magnetic layer 26.

In FIG. 7, the same reference numerals as those in FIG. 6 denote the same layers each made of the same material having the same thickness as those in FIG. 6 unless otherwise specified.

In the magnetic detecting element shown in FIG. 7, an in-stack bias layer 82 is formed on the upper antiferromagnetic layer 29 with an intermediate layer provided therebetween, instead of the hard bias layers formed on both sides of the free magnetic layer 26. A multilayer film T4 comprises a laminate of layers from the underlying layer 21 to the in-stack bias layer 82.

The in-stack bias layer 82 is made of a hard magnetic material such as CoPt or the like, and is magnetized in antiparallel to the X direction shown in the drawing. Also, an underlying layer composed of Cr may be formed between the in-stack bias layer 82 and the intermediate layer 81. The material of the intermediate layer 81 is the same as that of the intermediate layer 81 of the magnetic detecting element shown in FIG. 5.

In this embodiment, a longitudinal bias magnetic field (static magnetic field) is supplied from both ends of the in-stack bias layer 82 to the free magnetic layer 26 (shown by arrows M) to orient magnetization of the second magnetic layer 55 of the free magnetic layer 26 in the X direction shown in the drawing.

In the magnetic detecting element shown in FIG. 7, ferromagnetic coupling between the first and second magnetic layers 53 and 55 of the free magnetic layer 26 is weakened. Namely, the first and second magnetic layers 53 and 55 are out of direct contact, and small waviness occurs on the surface of each of the first and second magnetic layers 53 and 55 to cause less topological coupling.

With the weak ferromagnetic coupling between the first and second magnetic layers 53 and 55 of the free magnetic layer 26, the magnetization directions of the first and second magnetic layers 53 and 55 are antiparallel to each other, and the first and second magnetic layers 53 and 55 are stabilized in terms of energy by magnetostatic coupling between the ends 53a and the ends 55a thereof.

Therefore, magnetization of the first magnetic layer 53 of the free magnetic layer 26 is oriented in a direction (antiparallel to the X direction) antiparallel to that of the second magnetic layer 55.

Like in the magnetic detecting element shown in FIG. 1, in the magnetic detecting element shown in FIG. 7, the first and second magnetic layers 53 and 55 of the free magnetic layer 26 are made of the same material, but the first and second magnetic layers 53 and 55 have different thicknesses t7 and t8, respectively. In FIG. 7, the thickness t8 of the second magnetic layer 55 near the in-stack bias layer 82 is larger than the thickness t7 of the first magnetic layer 53 (t8>t7).

Therefore, the magnetic moment per unit area of the second magnetic layer 55 is larger than that of the first magnetic layer 53 to stabilize the state in which magnetization of the second magnetic layer 55 is oriented in the same direction as the longitudinal bias magnetic field applied from the in-stack bias layer 82.

Like in the magnetic detecting element shown in FIG. 5, in the magnetic detecting element comprising the in-stack bias layer 80 shown in FIG. 7, the free magnetic layer 26 is not strongly magnetized to optimize the magnetic domain control of the free magnetic layer 26, thereby facilitating a change in magnetization of the free magnetic layer 26 with the external magnetic field. Also, insulating layers 83 each composed of alumina or $SiO_2$ are formed on both sides of the side end surfaces S4 of the multilayer film T4. Therefore, a shunt loss of the sensing current can be decreased.

In the magnetic detecting element shown in FIG. 7, the magnetization directions of the first and second magnetic layers 53 and 55 of the free magnetic layer 26 are oriented in antiparallel to each other, and thus the magnetization directions of the magnetic layer 52 of the pinned magnetic layer 24 and the magnetic layer 60 of the pinned magnetic layer 28 must be pinned in antiparallel directions so that the multilayer film T4 can exhibit the magnetoresistive effect.

The construction and manufacturing method of the pinned magnetic layers 24 and 28 in which the magnetization directions of the magnetic layer 52 of the pinned magnetic layer 24 and of the magnetic layer 60 of the pinned magnetic layer 28 are pinned in antiparallel directions are the same as those of the pinned magnetic layers 24 and 28 described above with reference to the magnetic detecting element shown in FIG. 6.

Although, in the magnetic detecting element shown in FIG. 7, the in-stack bias layer 82 is provided only on the upper antiferromagnetic layer 29, an in-stack bias layer may be provided below the lower antiferromagnetic layer 23, or in-stack bias layers may be provided above the antiferromagnetic layer 29 and below the antiferromagnetic layer 23.

However, when the magnetization directions of the first and second magnetic layers 53 and 55 of the free magnetic layer 26 are antiparallel to each other, the in-stack bias layer is preferably provided above the upper antiferromagnetic layer 29 or below the lower antiferromagnetic layer 23. In addition, of the first and second magnetic layers 53 and 55 of the free magnetic layer 26, the thickness of the magnetic layer nearer to the in-stack bias layer is preferably increased.

The magnetic detecting element shown in FIG. 7 comprises the current limiting layer 54 formed in the free magnetic layer 26, and can thus exhibit the same effect as the magnetic detecting element shown in FIG. 6.

Figure 8:
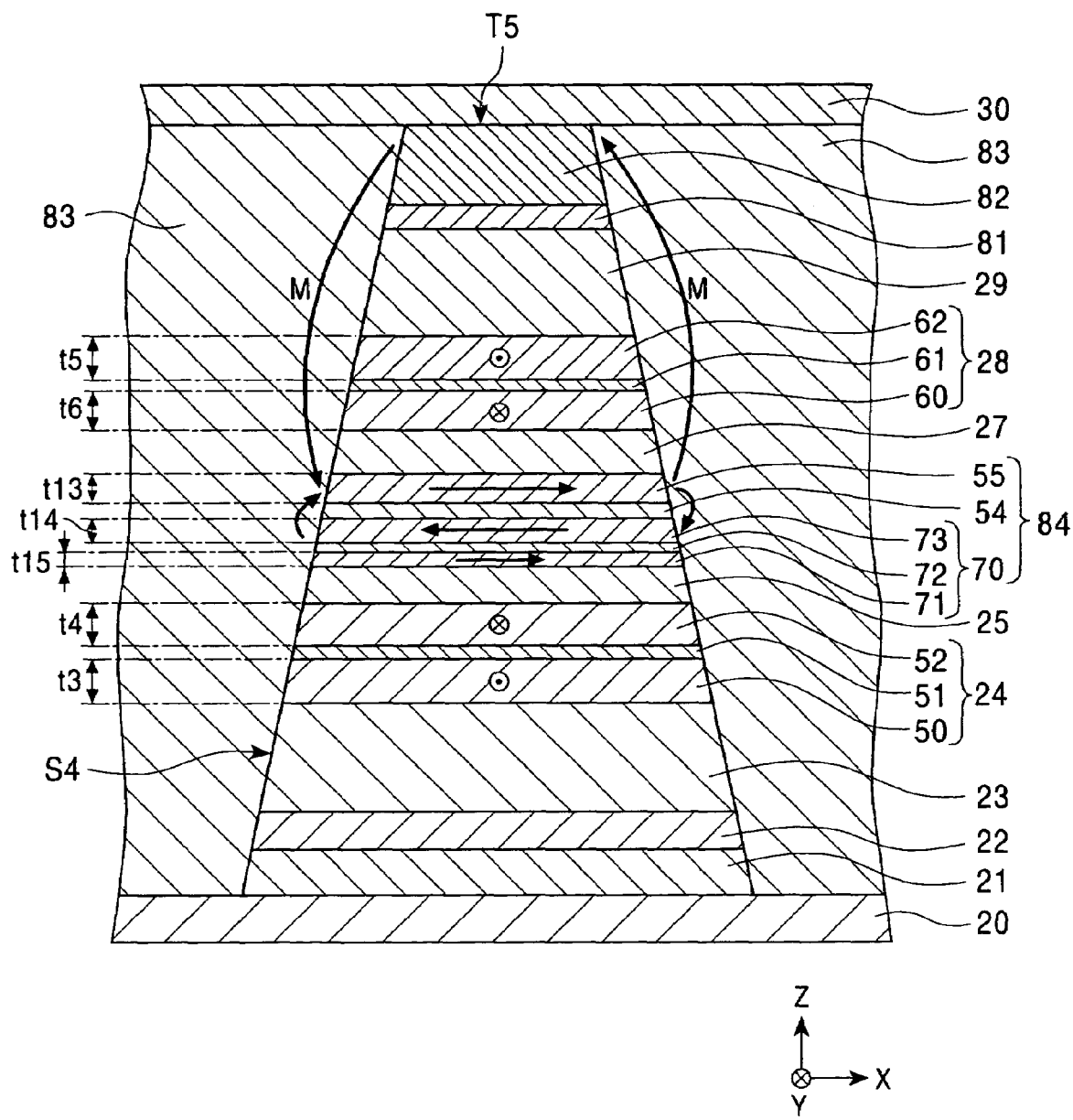
FIG. 8 is a sectional drawing of a magnetic detecting element according to a fifth embodiment of the present invention, as viewed from a side facing a recording medium.

FIG. 8 is a partial sectional view of the structure of a magnetic detecting element according to a fifth embodiment of the present invention, as viewed from a side facing a recording medium.

The magnetic detecting element shown in FIG. 8 is similar to the magnetic detecting element shown in FIG. 7. The magnetic detecting element shown in FIG. 8 is different from the magnetic detecting element shown in FIG. 7 in the structure of a free magnetic layer 84, the magnetization directions of magnetic layers 50 and 52 of a pinned magnetic layer 24 and the magnetization directions of magnetic layers 60 and 62 of a pinned magnetic layer 28.

In FIG. 8, the same reference numerals as those in FIG. 7 denote the same layers each made of the same material having the same thickness as those in FIG. 7 unless otherwise specified.

In this embodiment, a longitudinal bias magnetic field (static magnetic field) is supplied from both ends of the in-stack bias layer 82 to the free magnetic layer 84 (shown by arrows M) to orient magnetization of a second magnetic layer 55 of the free magnetic layer 84 in the X direction shown in the drawing.

In FIG. 8, a first magnetic layer 70 of the free magnetic layer 84 has a laminated ferrimagnetic structure comprising a laminate of a magnetic layer 71, a nonmagnetic intermediate layer 72 and a magnetic layer 73. Each of the magnetic layers 71 and 73 is made of a NiFe alloy, a CoFe alloy, Co, a CoNiFe alloy, or the like. The nonmagnetic intermediate layer 72 is made of at least one nonmagnetic material of Ru, Rh, Ir, Os, Re, Cr, and Cu.

In the magnetic detecting element shown in FIG. 8, ferromagnetic coupling between the magnetic layer 73 and the second magnetic layer 55 through the current limiting layer 54 is weakened, and thus the magnetic layer 73 and the second magnetic layer 55 have antiparallel magnetization directions and are magnetostatically coupled with each other. Therefore, these magnetic layers are stabilized in terms of energy.

Also, the magnetic layers 73 and 71 of the first magnetic layer 70 are antiferromagnetically coupled with each other by a RKKY interaction through the nonmagnetic intermediate layer 72, so that the magnetization directions of the magnetic layers 73 and 71 are oriented in antiparallel to each other.

Namely, the magnetization direction of the uppermost second magnetic layer 55 and the lowermost magnetic layer 71 of the free magnetic layer 84 are oriented in parallel to each other.

Therefore, even when the magnetization direction of the magnetic layer 52 contributing to the magnetoresistive effect in the pinned magnetic layer 24 is parallel to the magnetization direction of the magnetic layer 60 contributing to the magnetoresistive effect in the pinned magnetic layer 28, a multilayer film T5 ranging from the underlying layer 21 to the in-stack bias layer 82 can exhibit the magnetoresistive effect.

Like in the magnetic detecting elements shown in FIGS. 1 and 5, in the magnetic detecting element shown in FIG. 8, the magnetic layers 50 and 52 of the pinned magnetic layer 24 are made of magnetic materials having the same composition, and the thickness t3 of the magnetic layer 50 is smaller than the thickness t4 of the magnetic layer 52. Also, the magnetic layers 60 and 62 of the pinned magnetic layer 28 are made of magnetic materials having the same composition, and the thickness t5 of the magnetic layer 62 is smaller than the thickness t6 of the magnetic layer 60.

Therefore, the magnetic moment per unit area of the magnetic layer 50<the magnetic moment per unit area of the magnetic layer 52, and the magnetic moment per unit area of the magnetic layer 62<the magnetic moment per unit area of the magnetic layer 60. In manufacturing the magnetic detecting element shown in FIG. 8, the magnetization directions of the magnetic layers 52 and 60 can be pinned in the height direction (the Y direction shown in the drawing) by only one time of magnetic field annealing.

In the magnetic detecting element shown in FIG. 8, the second magnetic layer 55, the magnetic layer 73 and the magnetic layer 71 of the free magnetic layer 84 are made of the same material, and the thicknesses t13, t14 and t15 of the second magnetic layer 55, the magnetic layer 73 and the magnetic layer 71, respectively, have the relationship t13>t14>t15, for stabilizing the magnetization state.

In the magnetic detecting element shown in FIG. 8, the in-stack bias layer 82 is formed only on the upper antiferromagnetic layer 29. However, an in-stack bias layer may be provided below the lower antiferromagnetic layer 23, or in-stack bias layers may be provided on the antiferromagnetic layer 29 and below the antiferromagnetic layer 23. Instead of the in-stack bias layer 82, the hard bias layers 33 shown in FIG. 6 may be provided for supplying a longitudinal bias magnetic field to the free magnetic layer 26 (particularly, the second magnetic layer 55).

Also, the first magnetic layer 70 may comprise a single magnetic layer, and the second magnetic layer 55 may have a laminated ferrimagnetic structure.

The magnetic detecting element shown in FIG. 8 comprises the current limiting layer 54 formed in the free magnetic layer 84, and can thus exhibit the same effect as the magnetic detecting element shown in FIG. 7.

Figure 9:
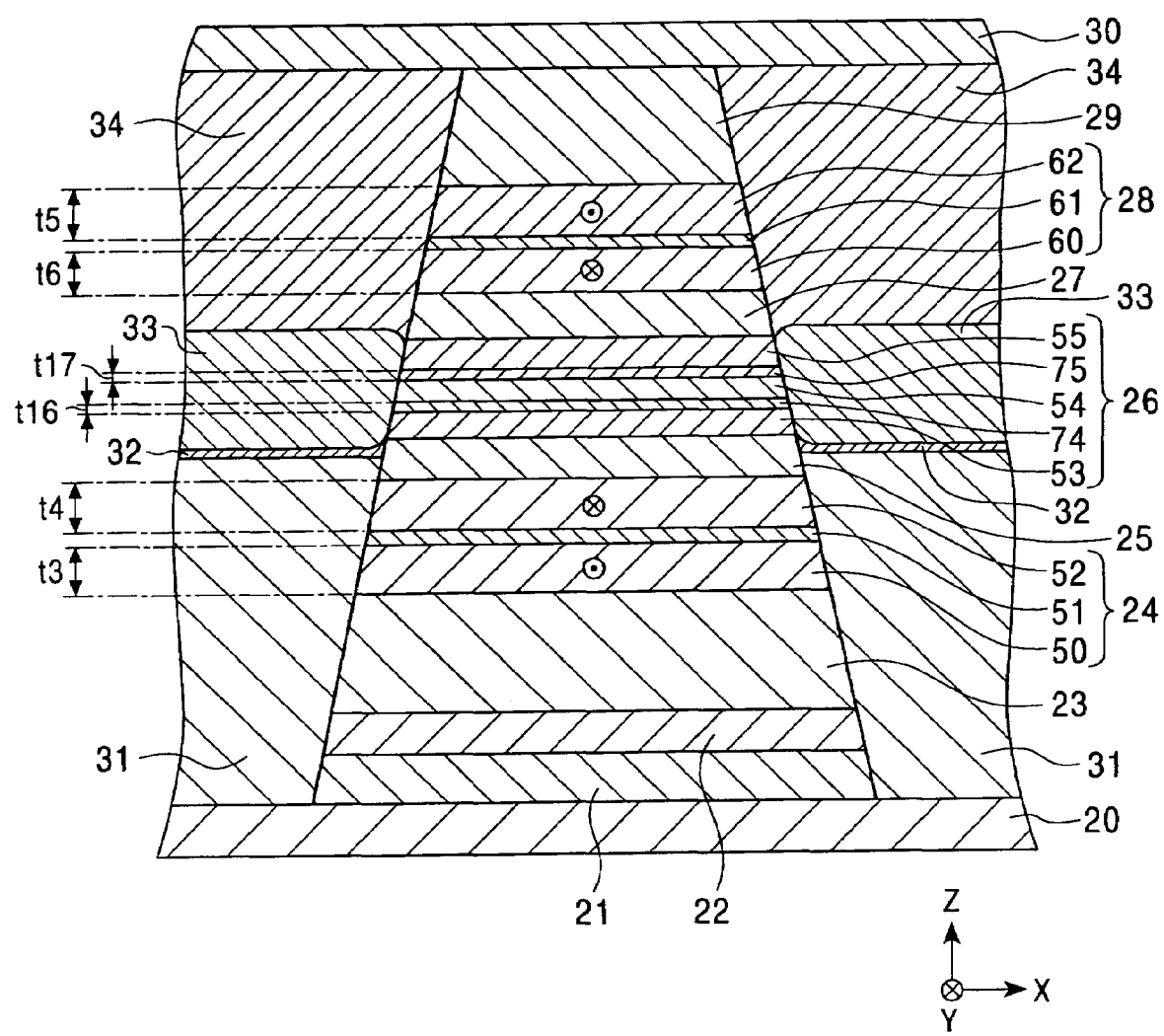
FIG. 9 is a sectional drawing of a magnetic detecting element according to a sixth embodiment of the present invention, as viewed from a side facing a recording medium.

FIG. 9 is a partial sectional view of the structure of a magnetic detecting element according to a sixth embodiment of the present invention, as viewed from a side facing a recording medium.

The magnetic detecting element shown in FIG. 9 is similar to the magnetic detecting element shown in FIG. 1. The magnetic detecting element shown in FIG. 9 is different from the magnetic detecting element shown in FIG. 1 in that a noble metal material layer 74 is formed between a current limiting layer 54 and a first magnetic layer 53, and a noble metal material layer 75 is formed between the current limiting layer 54 and a second magnetic layer 55.

In FIG. 9, the same reference numerals as those in FIG. 1 denote the same layers each made of the same material having the same thickness as those in FIG. 1 unless otherwise specified.

Each of the noble metal material layers 74 and 75 is made of at least one noble metal material of Ru, Pt, Au, Rh, Ir, Pd, Os, and Re. Instead of the noble metal material layers 74 and 75, Cu layers may be formed.

Also, one of the noble metal material layers 74 and 75 may be formed.

It is important for the current limiting layer 54 to have a high conductivity contract between an aperture (hole) and a non-aperture (insulating material film), otherwise the sensing current flowing from an electrode layer cannot be properly narrowed by the aperture to fail to improve apparent $\Delta R*A$ (change in resistance*element area).

Namely, in forming the insulating material film constituting the current limiting layer 54, the insulating material film must be formed in, for example, islands by aggregation. The aperture must be randomly mixed and must be a fine size. An important factor for control is the material and sputtering conditions, and another factor is the surface energy (γs) of a base formed below the current limiting layer 54.

With the base having high surface energy, a growth mode of a thin film easily becomes a complete wetting mode to facilitate the growth of a single layer (FM mode). In the official journal of Magnetics of Society of Japan "Introduction to Thin film Growth Process", Vol. 14, No. 3, 1990, p. 528, it is described that when the relationship γs>γfs+γf (wherein γfs is interfacial energy between a substrate and a thin film, and γf is surface energy of the thin film) is established, a complete wetting mode occurs to cause the growth of a single layer.

Therefore, in order to inhibit the growth of a single layer, i.e., to form the thin film on the substrate so that the thin film is scattered as islands, the surface energy (γs) of the substrate must be decreased.

In the present invention, in consideration of this point, the noble metal material layer 74 composed of a noble metal element having low surface energy is formed below the current limiting layer 54. The surface energy of the noble metal material layer 74 must be lower than the surface energy of a magnetic detecting element formed below the noble metal material layer 74.

When the current limiting layer 54 is formed on the noble metal material layer 74, the insulating material film (or a layer turning to the insulating material film) constituting the current limiting layer 54 is grown to islands by aggregation on the noble metal material layer 74. This growth mode is referred to as a "Volmer-Weber (VW) growth".

By providing the noble metal material layer 74 composed of a noble metal element, the influence of oxidation can be stopped by the noble metal material layer 74, for example, when a metal film is aggregated in islands on the noble metal material layer 74, and then oxidized to form an insulating material film comprising an oxide, thereby preventing the influence of oxidation on lower layers. If the first magnetic layer 53 is oxidized, soft magnetic properties deteriorate, and conduction electrons are scattered in an oxidized portion to make the current density uniform.

Therefore, the insulating material film constituting the current limiting layer 54 can be appropriately formed in, for example, islands while maintaining a high contrast between the aperture and non-aperture.

Also, the noble metal material layer 75 composed of a noble metal element is formed on the current limiting layer 54, and thus the noble metal material layer 75 can prevent oxygen diffusion to a layer above the current limiting layer 54 in heat treatment after the current limiting layer 54 is formed, thereby maintaining a high contrast between the aperture and non-aperture of the current limiting layer 54.

In the embodiment shown in FIG. 9, the current limiting layer 54 is sandwiched between layers each composed of a noble metal element to maintain a high contrast between the aperture and non-aperture of the current limiting layer 54. Thus, ΔR*A can be increased, and a magnetic detecting element having high reproduction output and excellent reproducing characteristics can be manufactured.

The noble metal material layers 74 and 75 can be seen by a transmission electron microscope (TEM).

When the thicknesses t16 and t17 of the noble metal material layers 74 and 75 are 2 Å to 10 Å, the first and second magnetic layers 53 and 55 of the free magnetic layer 26 can be ferromagnetically coupled with each other. A structure in which the noble metal material layers 74 and 75 are formed above and below the current limiting layer 54 can be applied to the magnetic detecting elements shown in FIGS. 5 to 8, and the magnetic detecting elements shown in FIGS. 10 to 14.

Any one of the magnetic detecting elements of the above-described embodiments is the dual spin-valve magnetoresistive element in which the nonmagnetic material layer and the pinned magnetic layer are formed above the free magnetic layer, and the nonmagnetic material layer and the pinned magnetic layer are also formed below the free magnetic layer. However, the structure of the present invention in which the free magnetic layer comprises a plurality of magnetic layers laminated with the current limiting layer provided therebetween can exhibit an effect even when being applied to a single spin-valve magnetoresistive element in which the nonmagnetic material layer and the pinned magnetic layer are formed above or below the free magnetic layer.

Figure 10:
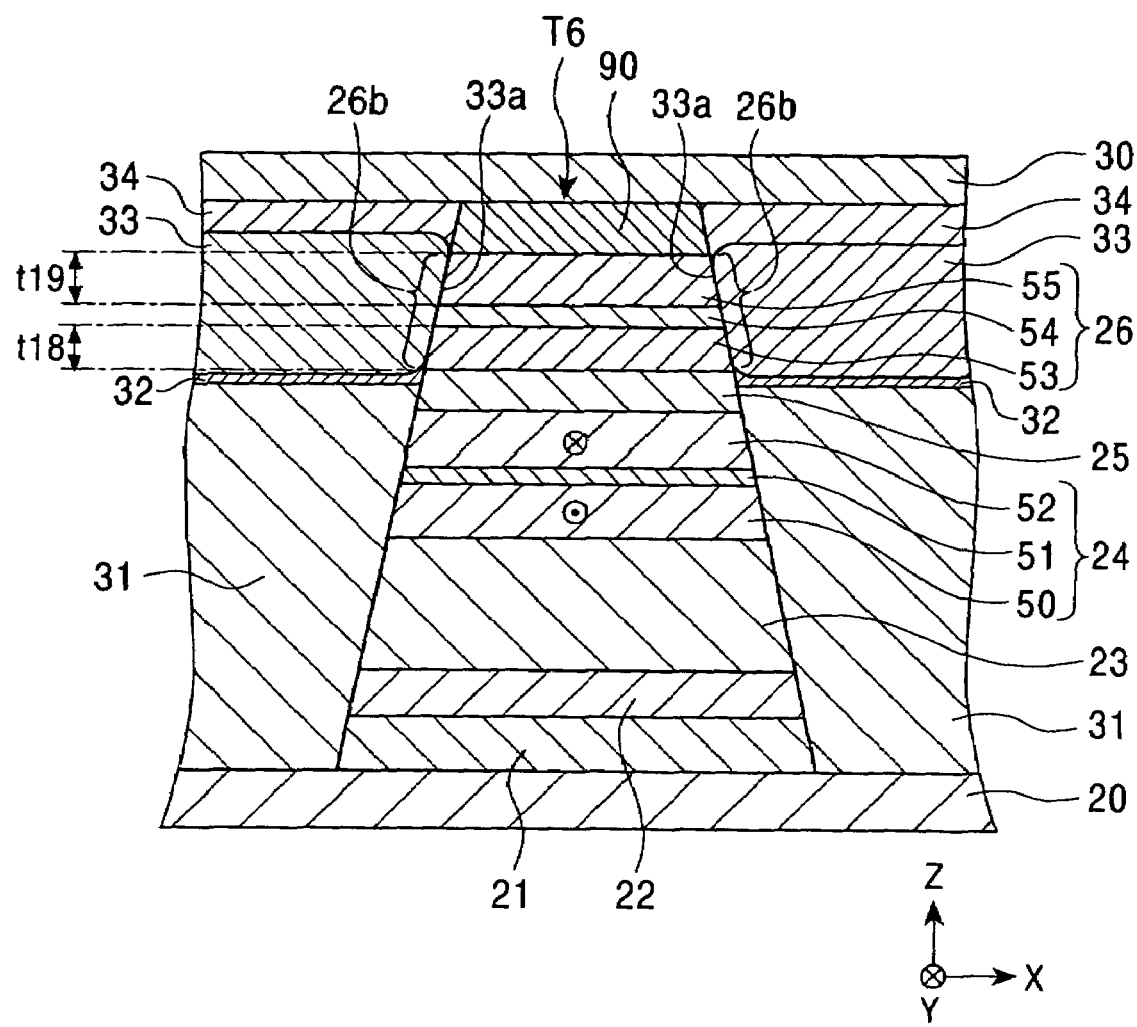
FIG. 10 is a sectional drawing of a magnetic detecting element according to a seventh embodiment of the present invention, as viewed from a side facing a recording medium.
Figure 11:
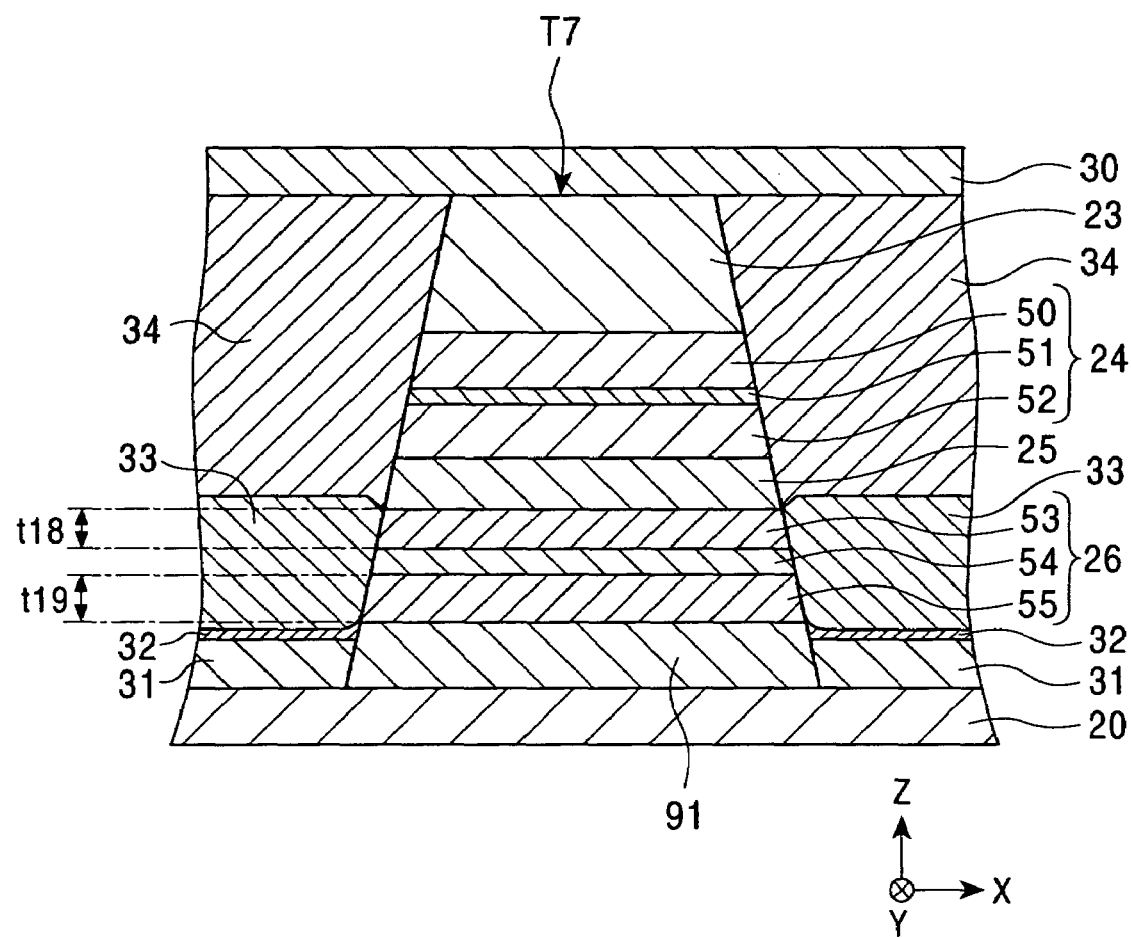
FIG. 11 is a sectional drawing of a magnetic detecting element according to an eighth embodiment of the present invention, as viewed from a side facing a recording medium.
Figure 12:
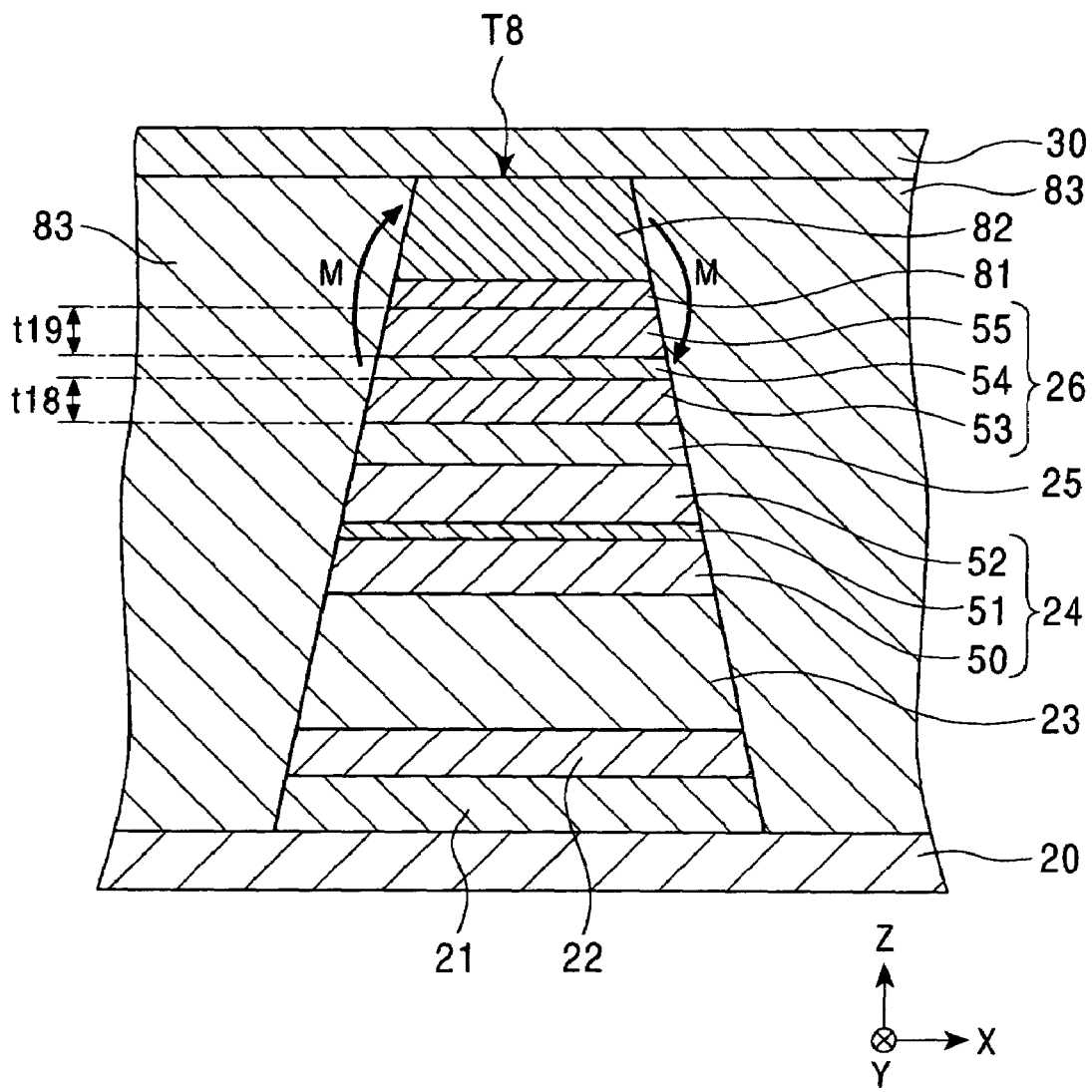
FIG. 12 is a sectional drawing of a magnetic detecting element according to a ninth embodiment of the present invention, as viewed from a side facing a recording medium.

FIGS. 10 to 12 are partial sectional views showing the structures of magnetic detecting elements according to seventh to ninth embodiments of the present invention, as viewed from a side facing a recording medium. The magnetic detecting elements of the seventh to ninth embodiments are single spin-valve magnetic detecting elements.

In the magnetic detecting element shown in FIG. 10, a multilayer film T6 is formed at the center of the top of a first electrode layer 20, the multilayer film T6 comprising an underlying layer 21, a seed layer 22, an antiferromagnetic layer 23, an pinned magnetic layer 24 of a three-layer ferrimagnetic structure comprising magnetic layers 50 and 52 and an intermediate layer 51 formed therebetween and composed of Ru, a nonmagnetic material layer 25, a free magnetic layer 26 comprising a first magnetic layer 53, a current limiting layer 54 and a second magnetic layer 55, and a protective layer 90, which are laminated in turn from below. Namely, the magnetic detecting element shown in FIG. 10 is a so-called bottom spin-valve magnetic detecting element.

Also, insulating layers 31, bias underlying layers 32, hard bias layers 33 and insulating layers 34 are laminated in turn on both sides of the multilayer film T6 in the track width direction (the X direction).

Furthermore, a second electrode layer 30 is formed on the insulating layers 34 and the protective layer 90.

In the magnetic detecting element shown in FIG. 10, the multilayer film T6 has the same laminated structure as that of the portion (the underlying layer 21, the seed layer 22, the antiferromagnetic layer 23, the pinned magnetic layer 24 in the three-layer ferrimagnetic structure, the nonmagnetic material layer 25, and the free magnetic layer 26 having the current limiting layer 54) below the free magnetic layer 26 of the multilayer film T1 of the magnetic detecting element shown in FIG. 1. In FIG. 10, the same reference numerals as those in FIG. 1 denote layers each made of the same material having the same thickness as those in FIG. 1 unless otherwise specified.

The protective layer 90 is made of Ta or at least one noble metal material of Ru, Pt, Au, Rh, Ir, Pd, Os, and Re. The thickness of each of the insulating layers 34 is smaller than that in the magnetic detecting element shown in FIG. 1.

In the magnetic detecting element shown in FIG. 11, a multilayer film T7 is formed at the center of the top of a first electrode layer 20, the multilayer film T7 comprising an underlying layer 91, a free magnetic layer 26 comprising a second magnetic layer 55, a current limiting layer 54 and a first magnetic layer 53, a nonmagnetic material layer 25, a pinned magnetic layer 24 of a three-layer ferrimagnetic structure comprising magnetic layers 52 and 50 and an intermediate layer 51 formed therebetween and composed of Ru or the like, and an antiferromagnetic layer 23, which are laminated in turn from below. Namely, the magnetic detecting element shown in FIG. 11 is a so-called top spin-valve magnetic detecting element.

Also, insulating layers 31, bias underlying layers 32, hard bias layers 33 and insulating layers 34 are laminated in turn on both sides of the multilayer film T7 in the track width direction (the X direction). Furthermore, a second electrode layer 30 is formed on the insulating layers 34 and the antiferromagnetic layer 23.

In the magnetic detecting element shown in FIG. 11, the multilayer film T7 has a lamination order opposite to that of the multilayer film T6 of the magnetic detecting element shown in FIG. 10. In FIG. 11, the same reference numerals as those in FIG. 10 denote layers each made of the same material having the same thickness as those in FIG. 10 unless otherwise specified.

The underlying layer 91 is made of Ta, for aligning the crystal orientations of the second magnetic layer 55 and upper layers to improve the soft magnetic characteristics of the free magnetic layer 26.

Although the magnetic detecting element shown in FIG. 12 is similar to the magnetic detecting element shown in FIG. 10, the magnetic detecting element shown in FIG. 12 is different from the magnetic detecting element shown in FIG. 10 in that instead of the hard bias layers formed on both sides of the free magnetic layer 26, an in-stack bias layer 82 is formed on the free magnetic layer 26 with an intermediate layer 81 provided therebetween. A multilayer film T8 comprises a laminate ranging from the underlying layer 21 to the in-stack bias layer 82.

The in-stack bias layer 82 is made of a hard magnetic material such as CoPt or the like, and is magnetized in a direction antiparallel to the X direction. Also, an underlying layer composed of Cr may be formed between the in-stack bias layer 82 and the intermediate layer 81. The material of the intermediate layer 81 is the same as that of the intermediate layer 81 of the magnetic detecting element shown in FIG. 5.

In this embodiment, a longitudinal bias magnetic field (static magnetic field) is supplied from both ends of the in-stack bias layer 82 to the free magnetic layer 26 (shown by arrows M) to orient magnetization of one or both of the first and second magnetic layers 53 and 55 of the free magnetic layer 26 in a direction antiparallel to the X direction shown in the drawing.

In each of the embodiments shown in FIGS. 10 to 12, the first and second magnetic layers 53 and 55 are preferably ferromagnetically coupled with each other through the current limiting layer 54 by direct contact or topological coupling so that the magnetization directions of the first and second magnetic layers 53 and 55 are oriented in parallel to each other.

When the first and second magnetic layers 53 and 55 have the same magnetic moment per unit area, the first and second magnetic layers 53 and 55 tend to have the same angle of magnetization rotation when the external magnetic field is applied, and thus the magnetization directions of the first and second magnetic layers 53 and 55 are easily oriented in parallel to each other.

However, in the magnetic detecting elements shown in FIGS. 10 and 11, the hard bias layers 33 are formed on both sides of the free magnetic layer 26 to apply a static magnetic field (longitudinal magnetic field) in the track width direction (the X direction) to both the first and second magnetic layers 53 and 55. Therefore, with the large static magnetic field applied from the hard bias layers 33, if the first and second magnetic layers 53 and 55 are magnetically separated or the first and second magnetic layers 53 and 55 have different magnetic moments per unit area, the magnetization directions of the first and second magnetic layers 53 and 55 can be oriented in parallel to each other.

On the other hand, when the first and second magnetic layers 53 and 55 are out of direct contact to cause weak topological coupling therebetween, the magnetization directions of the first and second magnetic layers 53 and 55 are oriented in antiparallel to each other in some cases.

When the magnetization directions of the first and second magnetic layers 53 and 55 are antiparallel to each other, the magnetic moment per unit area of the first magnetic layer 53 is preferably differentiated from that of the second magnetic layer 55 to stabilize the layers in terms of energy. More preferably, the inner end surfaces 33a of the hard bias layers 33 are preferably arranged to face the respective end surfaces of one of the first and second magnetic layers 53 and 55, and the magnetic moment per unit area of one of the first and second magnetic layers 53 and 55, which is nearer to the in-stack bias layer 82, is changed.

When the first and second magnetic layers 53 and 55 are made of magnetic materials having the same composition, an inequality between the magnetic moments per unit area of the first and second magnetic layers 53 and 55 can be determined by an inequality between the thicknesses t18 and t19 of the first and second magnetic layers 53 and 55.

In the single spin-valve magnetic detecting elements shown in FIGS. 10 to 12, the current limiting layer 54 is formed in the free magnetic layer 26, and thus the current density of the sensing current flowing through the free magnetic layer 26 can be securely locally increased.

Therefore, even if the element area (the optical element area) of the free magnetic layer 26 in parallel to the film plane is increased to 0.01 $\mu m^2$ or more, the element area (the effective element area) in which the sensing current actually flows through the free magnetic layer 26 to contribute to the magnetoresistive effect can be decreased. Thus, a CPP-type magnetic detecting element producing large $\Delta R$ and high reproduction output can easily be formed.

Since the element area of the free magnetic layer 26 can be increased to 0.01 $\mu m^2$ or more, the external magnetic field from the recording medium can be effectively detected by the magnetic detecting element, and reproduction output and stability of a reproduction waveform can be improved.

Figure 13:
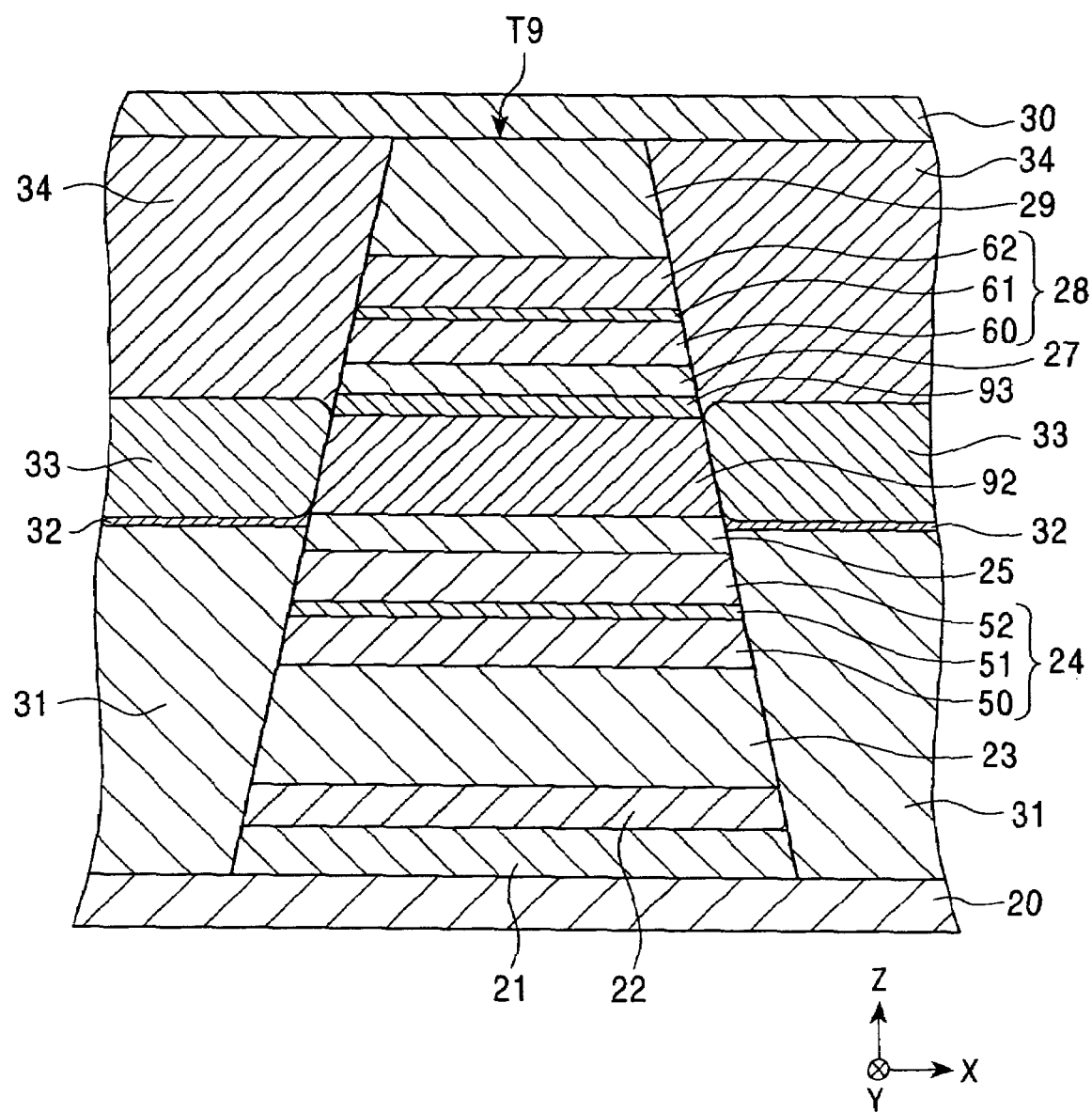
FIG. 13 is a sectional drawing of a magnetic detecting element according to a tenth embodiment of the present invention, as viewed from a side facing a recording medium.

FIG. 13 is a partial sectional view of the structure of a magnetic detecting element according to a tenth embodiment of the present invention, as viewed from a side facing a recording medium.

The magnetic detecting element shown in FIG. 13 is different from the above-described magnetic detecting elements in that a current limiting layer 93 is formed between a free magnetic layer 92 and a nonmagnetic material layer 27.

Also, a nonmagnetic material layer 25, a pinned magnetic layer 24 of a three-layer ferrimagnetic structure comprising magnetic layers 50 and 52 and an intermediate layer 51 formed therebetween and made of Ru or the like, an antiferromagnetic layer 23, a seed layer 22, an underlying layer 21 and a first electrode layer 20 are formed below the free magnetic layer 92. Furthermore, the nonmagnetic material layer 27, a pinned magnetic layer 28 of a three-layer ferrimagnetic structure comprising magnetic layers 60 and 62 and an intermediate layer 61 formed therebetween and made of Ru or the like, an antiferromagnetic layer 29, and a second electrode layer 30 are formed in turn above the current limiting layer 93.

Furthermore, insulating layers 31, bias underlying layers 32, hard bias layers 33 and insulating layers 34 are laminated in turn on both sides of a multilayer film T9 in the track width direction (the X direction shown in the drawing), the multilayer film T9 ranging from the underlying layer 21 to the antiferromagnetic layer 29.

In FIG. 13, the same reference numerals as those in FIG. 1 denote the same layers each made of the same material having the same thickness as in FIG. 1 unless otherwise specified.

The free magnetic layer 92 is made of a NiFe alloy, a CoFe alloy, Co, a CoNiFe alloy, or the like. The free magnetic layer 92 preferably have a three-layer structure comprising Co film or CoFe films for preventing diffusion, and a NiFe alloy or CoNiFe alloy film formed therebetween.

The free magnetic layer 92 may be a laminated ferrimagnetic free magnetic layer comprising a plurality of magnetic material layers, and intermediate layers provided therebetween and comprising a nonmagnetic material.

The current limiting layer 93 has the same structure as the current limiting layer 54 of each of the above-described magnetic detecting elements. The current limiting layer 93 may be formed between the free magnetic layer 92 and the lower nonmagnetic material layer 25. As in the magnetic detecting element shown in FIG. 9, noble metal material layers are preferably formed below and above the current limiting layer 93.

Figure 14:
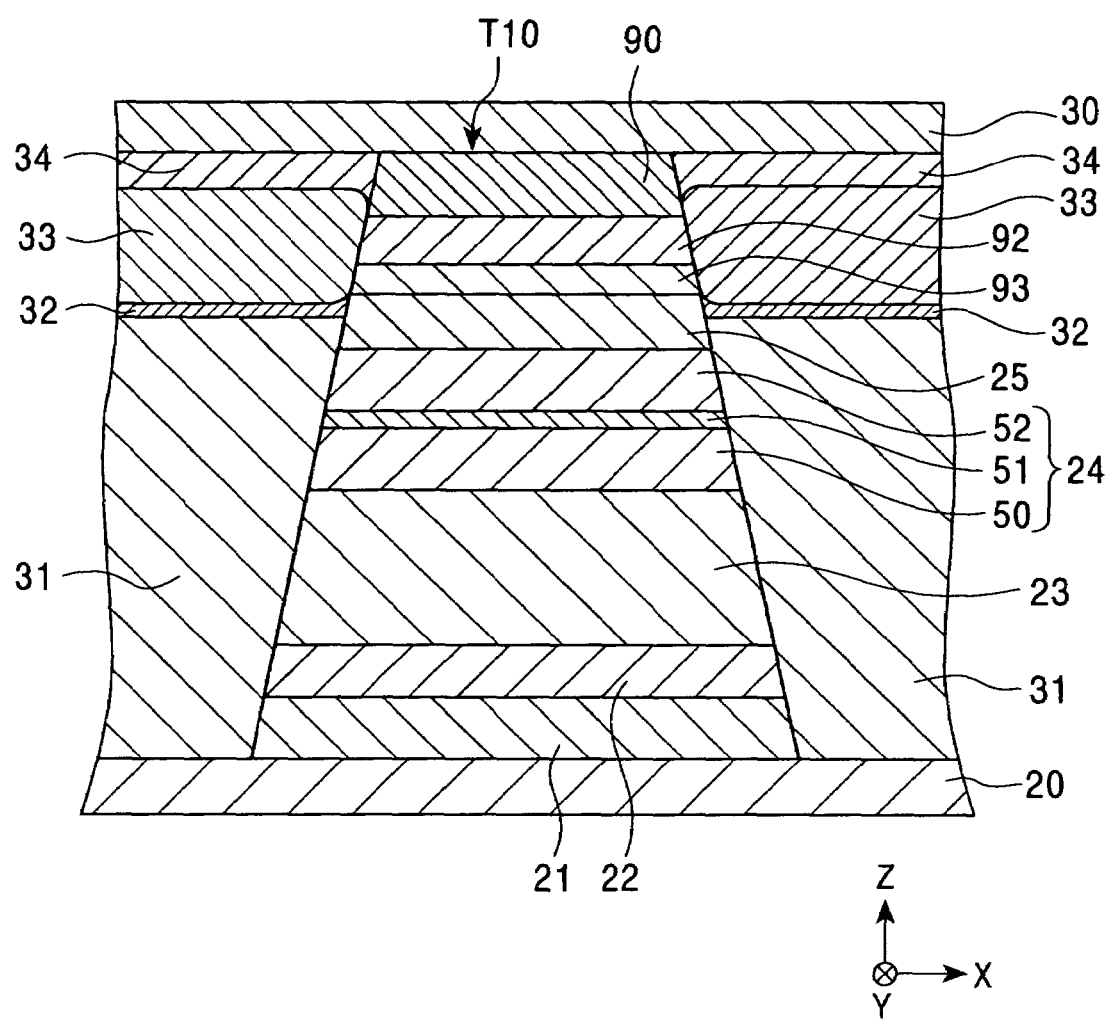
FIG. 14 is a sectional drawing of a magnetic detecting element according to an eleventh embodiment of the present invention, as viewed from a side facing a recording medium.

FIG. 14 is a partial sectional view of the structure of a magnetic detecting element according to an eleventh embodiment of the present invention, as viewed from a side facing a recording medium.

The magnetic detecting element shown in FIG. 14 comprises a multilayer film T10 formed at the center of the top of a first electrode layer 20, the multilayer film T10 comprising an underlying layer 21, a seed layer 22, an antiferromagnetic layer 23, a pinned magnetic layer 24 of a three-layer ferrimagnetic structure comprising magnetic layers 50 and 52 and an intermediate layer 51 formed therebetween and made of Ru or the like, a nonmagnetic material layer 25, a current limiting layer 93, a free magnetic layer 92, and a protective layer 90, which are laminated in turn from below. The magnetic detecting element is a so-called bottom spin-valve magnetic detecting element.

Furthermore, insulating layers 31, bias underlying layers 32, hard bias layers 33 and insulating layers 34 are laminated in turn on both sides of a multilayer film T10 in the track width direction (the X direction shown in the drawing). A second electrode layer 30 is formed on the insulating layers 34 and the multilayer film T10.

In FIG. 14, the same reference numerals as those in FIG. 13 denote the same layers each made of the same material having the same thickness as in FIG. 13 unless otherwise specified. The protective layer 90 is made of Ta or at least one noble metal material of Ru, Pt, Au, Rh, Ir, Pd, Os, and Re. The thickness of each of the insulating layers 34 is smaller than that in FIG. 13.

In the magnetic detecting elements shown in FIGS. 13 and 14, the current limiting layer 93 is formed between the free magnetic layer 92 and the nonmagnetic material layer 27 or 25, and thus the current density of the sensing current flowing through the free magnetic layer 92 can be locally securely increased.

Therefore, even if the element area (referred to as the "optical element area") of the free magnetic layer 92 in parallel to the film plane is increased to 0.01 $\mu m^2$ or more, the element area (referred to as the "effective element area") in which the sensing current actually flows through the free magnetic layer 92 to participate in the magnetoresistive effect can be decreased. Thus, a CPP-type magnetic detecting element producing large $\Delta R$ and high reproduction output can easily be formed.

Since the element area of the free magnetic layer 92 can be increased to 0.01 $\mu m^2$ or more, the external magnetic field from the recording medium can be effectively detected by the magnetic detecting element, and reproduction output and stability of a reproduction waveform can be improved.

However, when the current limiting layer 93 is formed between the free magnetic layer 92 and the nonmagnetic material layer 27 or 25, scattering of up-spin conduction electrons moving in the free magnetic layer 92 and the nonmagnetic material layer 27 or 25 must be suppressed, and the spin direction of the conduction electrons must be maintained constant (preventing the occurrence of spin flop).

In order to maintain the spin direction of the conduction electrons constant, a contrast between an aperture and a non-aperture of the current limiting layer 93 is preferably increased, and the aperture is preferably absent from an excessive impurity element, or the current limiting layer 93 is preferably made of a material causing less spin flop of the conduction electrons.

On the other hand, in the magnetic detecting elements shown in FIGS. 1 and 5 to 12 each comprising the current limiting layer 54 formed in the free magnetic layer, the spin of the conduction electrons may be changed in the current limiting layer 54.

Furthermore, shield layers (not shown) are provided above and below each of the magnetic detecting elements shown in FIGS. 1 and 5 to 14 with gap layers provided therebetween. A unit including the magnetic detecting element, the gap layers and the shield layers is referred to as a "MR head".

In FIGS. 1 and 5 to 14, the first and second electrode layers 20 and 30 may be used as the gap layers. When each of the first and second electrode layers 20 and 30 is made of a magnetic material, the first and second electrode layers 20 and 30 may be also used as the shield layers.

A recording inductive head may be laminated on the MR head. The shield layer (upper shield layer) formed above the magnetic detecting element may be also used as a lower core layer of the inductive head.

The MR head is formed at the trailing-side end of a slider comprising, for example, alumina-titanium carbide ($Al_2O_3$—TiC). The slider is bonded to an elastic deformable support member on the side opposite to the surface facing recording medium to form a magnetic head device.

The method of manufacturing the magnetic detecting element shown in FIG. 1 will be described.

Figure 15:
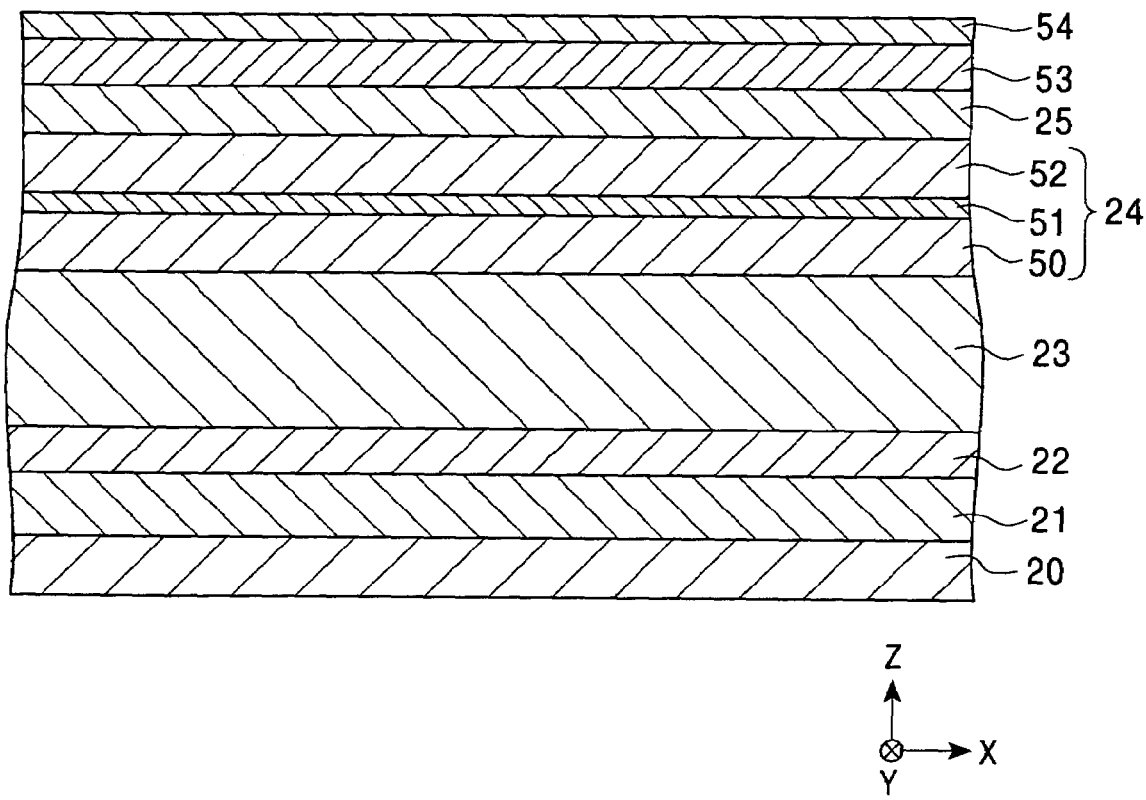
FIG. 15 is a drawing showing a step for manufacturing the magnetic detecting element shown in FIG. 1.
Figure 16:
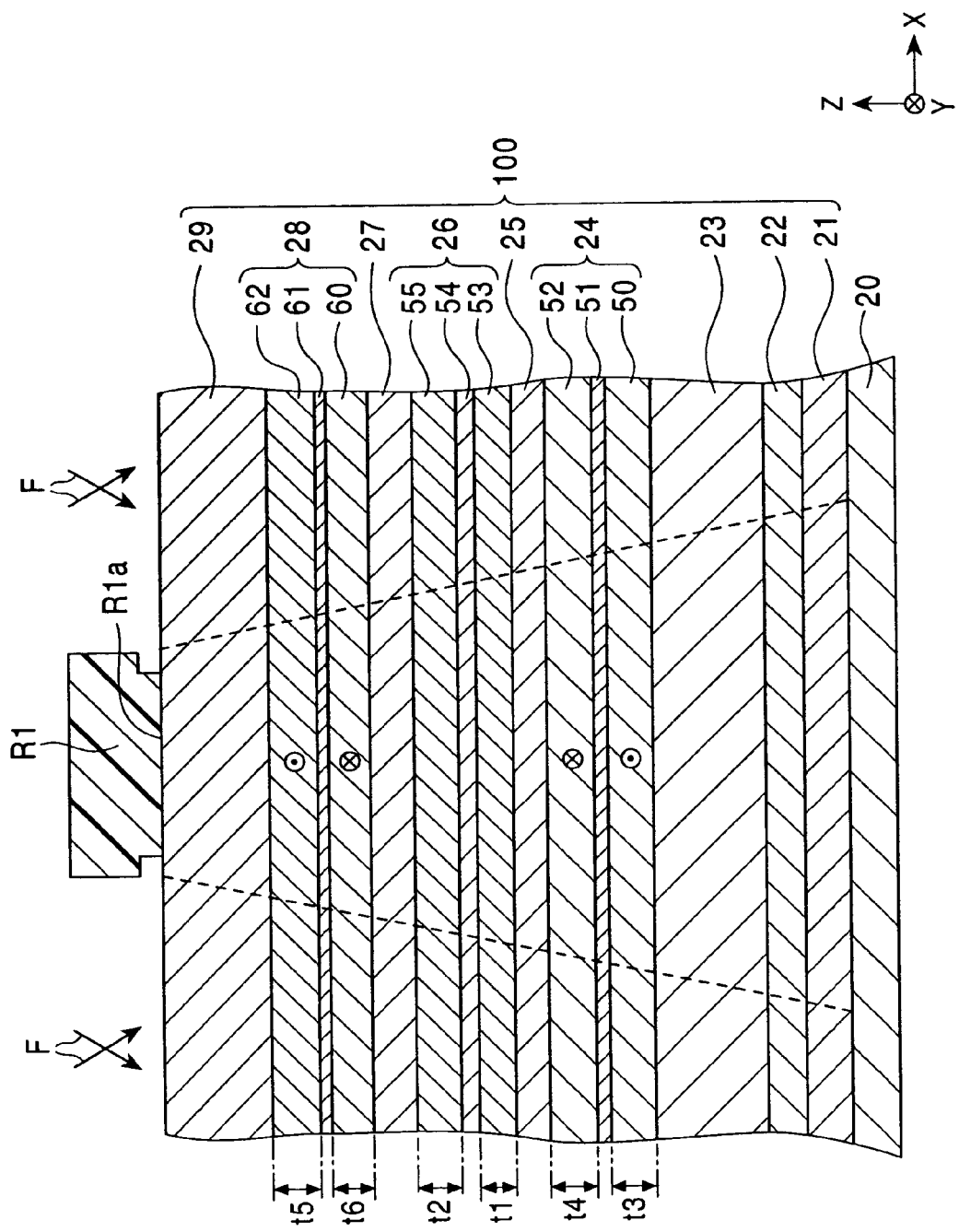
FIG. 16 is a drawing showing a step for manufacturing the magnetic detecting element shown in FIG. 1.
Figure 17:
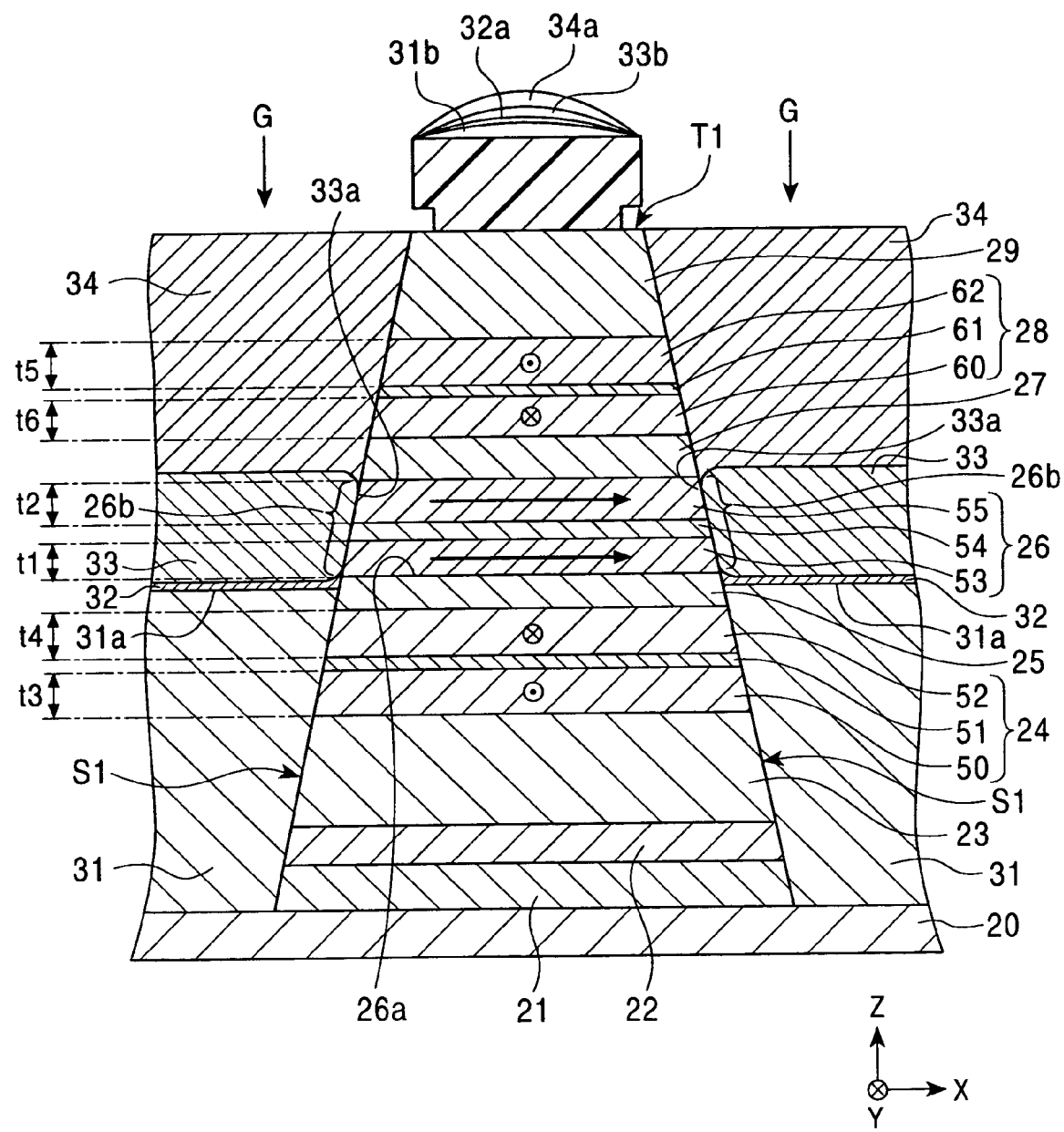
FIG. 17 is a drawing showing a step for manufacturing the magnetic detecting element shown in FIG. 1.

FIGS. 15, 16 and 17 are partial sectional views each showing the magnetic detecting element under manufacture, as viewed from the surface facing the recording medium.

In the step shown in FIG. 15, the underlying layer 21 made of Ta or the like, the seed layer 22 made of NiFeCr or the like, the antiferromagnetic layer 23 made of PtMn or the like, the pinned magnetic layer 24 of the three-layer ferrimagnetic structure comprising the magnetic layers 50 and 52 and the intermediate layer 51 formed therebetween and made of Ru or the like, the nonmagnetic material layer 25 made of Cu or the like, the first magnetic layer 53 turning to a portion of the free magnetic layer 26, and the current limiting layer 54 containing the insulating portion and the conductive portion are laminated in turn on the first electrode layer 21. The current limiting layer 54 also severs as a protecting layer for protecting the surface of the first magnetic layer 53.

The thickness of the current limiting layer 54 is 5 Å to 30 Å, the thickness of the first magnetic layer 53 is 10 Å to 100 Å, the thickness of the nonmagnetic material layer 25 is 18 Å to 40 Å, the thickness of the pinned magnetic layer 24 is 20 Å to 150 Å, the thickness of the antiferromagnetic layer 23 is 80 Å to 300 Å, the thickness of the seed layer 22 is 10 Å to 60 Å, the thickness of the underlying layer 21 is 10 Å to 30 Å, and the thickness of the first electrode layer is 0.1 µm to several µm.

The first magnetic layer 53 is made of a NiFe alloy, a CoFe alloy, Co, a CoNiFe alloy, or the like. Also, an anti-diffusion Co film or CoFe film is preferably formed below the first magnetic layer 53.

The method of forming the current limiting layer 54 will be described below.

In the next step shown in FIG. 16, the second magnetic layer 55 of the free magnetic layer 26, the nonmagnetic material layer 27, the pinned magnetic layer 28 of the three-layer ferrimagnetic structure comprising the magnetic layers 60 and 62 each made of Co or the like and the intermediate layer 61 made of Ru or the like, and the antiferromagnetic layer 29 are laminated on the current limiting layer 54.

The thickness of the second magnetic layer 55 is 10 Å to 100 Å, the thickness of the nonmagnetic material layer 27 is 18 Å to 40 Å, the thickness of the pinned magnetic layer 28 is 20 Å to 150 Å, and the thickness of the antiferromagnetic layer 29 is 80 Å to 300 Å.

The second magnetic layer 55 is made of a NiFe alloy, a CoFe alloy, Co, a CoNiFe alloy, or the like. Also, an anti-diffusion Co film or CoFe film is preferably formed above the second magnetic layer 55. The materials of the nonmagnetic material layer 27, the pinned magnetic layer 28 and the antiferromagnetic layer 29 are the same as those of the nonmagnetic material layer 25, the pinned magnetic layer 24 and the antiferromagnetic layer 23, respectively.

After a multilayer film 100 ranging from the antiferromagnetic layer 29 to the underlying layer 21 is deposited, the multilayer film 100 is annealed in a magnetic field in the height direction (the Y direction) to produce an exchange coupling magnetic field between the antiferromagnetic layer 23 and the magnetic layer 50 of the pinned magnetic layer 24 and between the antiferromagnetic layer 29 and the magnetic layer 62 of the pinned magnetic layer 28.

The temperature of the magnetic field annealing is, for example, 270° C., and the magnetic field is a strong magnetic field of 800 kA/m, or 8 to 30 kA/m, for example, 24 kA/m.

In FIG. 16, the magnetic layers 50 and 52 of the pinned magnetic layer 24 are formed by using magnetic material having the same composition, and the thickness t3 of the magnetic layer 50 is smaller than the thickness t4 of the magnetic layer 52. Also, the magnetic layers 60 and 62 of the pinned magnetic layer 28 are formed by using magnetic material having the same composition, and the thickness t5 of the magnetic layer 62 is smaller than the thickness t6 of the magnetic layer 60.

Therefore, the magnetic moment per unit area of the magnetic layer 50<the magnetic moment per unit area of the magnetic layer 52, and the magnetic moment per unit area of the magnetic layer 62<the magnetic moment per unit area of the magnetic layer 60.

Magnetizations of the magnetic layers 50 and 62 are pinned in a direction antiparallel to the height direction (the Y direction) by annealing in the magnetic field of 8 to 30 kA/m, and magnetizations of the magnetic layers 52 and 60 are pinned in the height direction (the Y direction) by a RKKY interaction through the intermediate layers 51 and 61, respectively.

In annealing in a magnetic field of 800 kA/m or more, magnetizations of the magnetic layers 50 and 62 are pinned in the height direction (the Y direction).

Next, a resist layer R1 is formed on the antiferromagnetic layer 29. The resist layer R1 is preferably a lift off resist layer.

The area of the bottom R1a of the resist layer R1 is the same as or slightly smaller than the optical element area of the magnetic detecting element. In the present invention, the track width Tw determined by the width dimension of the top (the top of the second magnetic layer 55) of the free magnetic layer 26 in the track width direction (the X direction) can be set to, for example, 0.15 µm to 0.3 µm, and the length MRh in the height direction (the Y direction) can be set to, for example, 0.15 µm to 0.3 µm. Therefore, the optical element area can be increased to 0.02 µm$^2$ to 0.09 µm$^2$. The optical element area of 0.02 µm$^2$ to 0.09 µm$^2$ can be achieved with the precision of a currently usable photolithography technique.

Next, a portion not covered with the resist layer R1 is removed from the multilayer film 100 ranging from the antiferromagnetic layer 29 to the underlying layer 21 by ion milling from arrow directions F (shown by dotted lines in FIG. 16). As a result, the multilayer film T1 ranging from the underlying layer 21 to the antiferromagnetic layer 29 and having a substantially trapezoidal sectional form is left at the center of the top of the first electrode layer 20. Since the material of the removed portion partially re-adheres to both side ends S1 of the multilayer film T1 after the ion milling, the material re-adhering to the side ends S1 is preferably removed by side milling.

In the next step shown in FIG. 17, the insulating layers 31 made of Al$_2$O$_3$ or the like, the bias underlying layers 32 made of Cr or the like, the hard bias layers 33 made of CoPtCr or the like, and the insulating layers 34 made of Al$_2$O$_3$ or the like are deposited over the first electrode layer 20 and both side ends S1 of the multilayer film T1 by sputtering.

As shown in FIG. 17, in sputtering deposition of each of the layers including the insulating layers 31 to the insulating layers 34, the irradiation angle of sputtering particles is preferably a direction G substantially perpendicular to a substrate.

As shown in FIG. 17, an insulating material film 31b, a bias underlying material layer 32a, a bias material layer 33b and an insulating material film 34a are also laminated on the resist layer R1.

After the layers from the insulating layers 31 to the insulating layers 34 are laminated on both sides of the multilayer film T1, the resist layer R1 is removed. When the whole surface of the resist layer R1 is covered with the insulating material film 31b and the like, the resist layer R1 cannot be appropriately removed. Therefore, a method is conceivable, in which the insulating material film 31b and the like which cover the surface of the resist layer R1 are partially removed by, for example, scrub cleaning, specifically collision of dry ice particles with each of the layers to partially expose the surface of the resist layer R1, and then the resist layer R1 is immersed in a solvent to dissolve the resist layer R1.

Since unnecessary burrs of the insulating material film 31b and the like remain on the insulating layers 34 and the multilayer film T1 after the resist layer R1 is removed, the tops of the insulating layers 34 and the multilayer film t1 are preferably cleaned by, for example, scrubbing to remove the burrs, thereby forming a clean surface. A possible example of the scrub cleaning method is a method in which dry ice particles are collided with the burrs.

Then, the second electrode layer 30 is deposited over the insulating layers 34 and the antiferromagnetic layer 29 of the multilayer film t1 by sputtering (refer to FIG. 1) to form the magnetic detecting element shown in FIG. 1.

The method of producing the current limiting layer 54 will be described in detail below.

FIGS. 18 to 27 are schematic drawings each showing the state of the top of the first magnetic layer 53 on which the current limiting layer 54 is formed.

In order to form the current limiting layer 54, an oxide film of $Al_2O_3$, $SiO_2$, or the like, or a nitride film of AlN or the like is first deposited on the first magnetic layer 53 by sputtering. In the present invention, the oxide film preferably comprises an insulating material composed of at least one oxide of Al, Si, Ti, Zr, Hf, Cr, Ta, V, Nb, Mo, W, Fe, Ni, and Co.

The nitride film preferably comprises an insulating material composed of at least one nitride of Al, Si, Ti, Zr, Hf, Cr, Ta, V, Nb, Mo, W, Fe, Ni, and Co.

Figure 18:
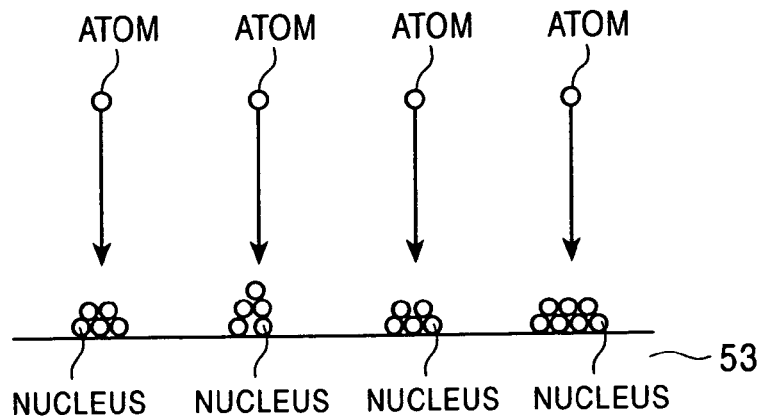
FIG. 18 is a schematic drawing showing the state of the top of a first magnetic layer on which a current limiting layer is formed.

The oxide film or nitride film is not easily formed in a continuous film on the first magnetic layer 53 of the free magnetic layer 26 depending upon the deposition conditions. Namely, the oxide film or nitride film comprises an insulating material that is easily formed in a discontinuous film. The material that is easily formed in a discontinuous film easily causes aggregation of the insulating material particles in the first magnetic layer 53 to easily form nuclei, as shown in FIG. 18.

In order to increase aggregability, it is important to appropriately control the sputtering conditions for sputtering deposition of the insulating material.

First, the substrate temperature is set to a low temperature of about 20° C. to 200° C., and the distance between the substrate and a target is set to about 200 mm to 300 mm. Also, the Ar gas pressure is as high as about 10 mTorr to 50 mTorr (1.3 Pa to 6.7 Pa).

Under these sputtering conditions, the atoms of the insulating material aggregate due to insufficient movement on the surface of the first magnetic layer 53 to easily form the nuclei.

Figure 19:
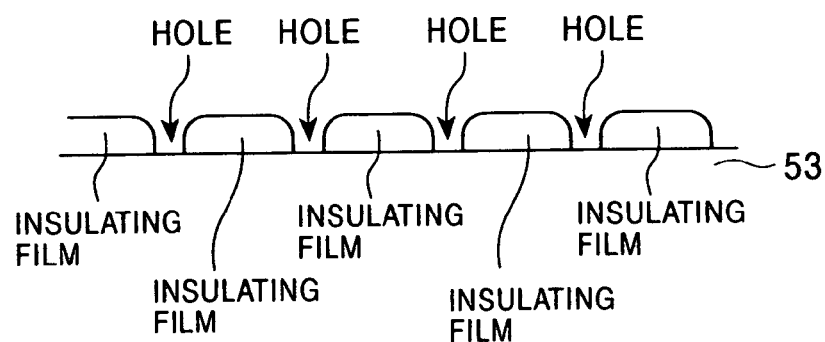
FIG. 19 is a partial schematic drawing showing a state after the step shown in FIG. 18.

FIG. 19 shows a state in which the nuclei are grown. In this way, the insulating material film formed on the first magnetic layer 53 has a plurality of holes extending from the top to the bottom of the insulating material film, as shown in FIG. 3. The insulating material film may have grooves which continuously extend in a plan view parallel to the film plane, as shown in FIG. 4.

Figure 20:
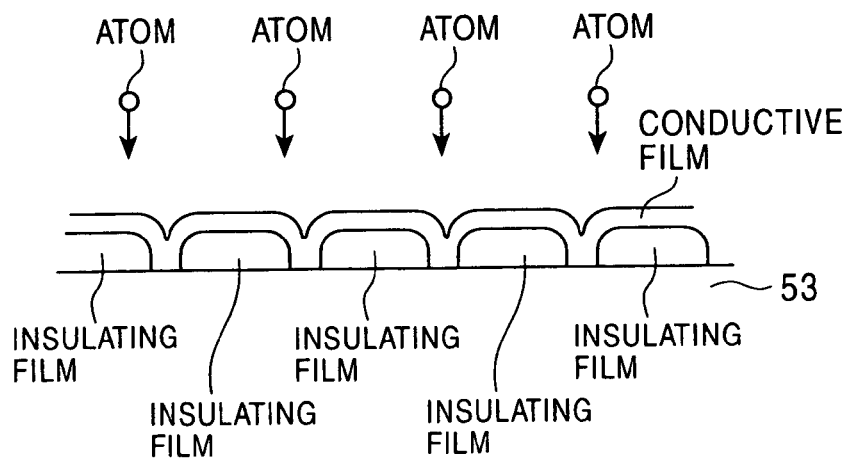
FIG. 20 is a partial schematic drawing showing a state after the step shown in FIG. 19.

In the next step shown in FIG. 20, a conductive material is deposited on the insulating material film and in the holes by sputtering. In this step, a conductive material layer is formed on the insulating material film and in the holes so that the holes are filled with the conductive material layer.

As the conductive material, α-Ta, Au, Cr, Cu (copper) or W (tungsten) can be used. However, at least one noble metal material of Ru, Pt, Au, Rh, Ir, Pd, Os, and Re is preferably used, or Cu may be used. By using the noble metal material, the conductive material layer can be caused to function as a protective layer for preventing oxygen diffusion in heat treatment because the noble metal material is less oxidized.

Therefore, the contrast between the apertures (holes) and the non-apertures (insulating film) of the current limiting layer can be kept high.

By using a magnetic material as the conductive material, the second magnetic layer 55 laminated on the current limiting layer 54 can be put into direct contact with the first magnetic layer 53 to permit ferromagnetic coupling between the first and second magnetic layers 53 and 55. However, the use of the magnetic material causes oxygen diffusion by heat treatment to decrease the contrast between the apertures (holes) and the non-aperture (insulating film) of the current limiting layer in some cases.

For example, the sputtering conditions for the conductive material include a substrate temperature of about 20° C. to 100° C., a substrate-target distance of about 40 mm to 100 mm, and an Ar gas pressure of about 0.5 mTorr to 10 mTorr (0.07 Pa to 1.3 Pa).

The current limiting layer 54 can be formed by the above-described manufacturing method.

In the present invention, a film of at least one metal element of Ag, Cu, Zn, Ge, Pb, Al, Ti, Zr, Hf, Cr, Ta, V, Nb, Mo, W, Fe, Co, Si, Ni, and the rare earth elements may be first deposited by sputtering. In this deposition, the sputtering is stopped in a state where a plurality of holes extending from the top to the bottom or grooves continuously extending in a plan view parallel to the film plane are properly left in a metal film. Next, the metal film is oxidized by natural oxidation, plasma oxidation, radical oxidation, or anodic oxidation.

In this oxidation step, the metal film is oxidized to form an insulating material film. In the step shown in FIG. 20, a conductive material is deposited on the insulating material film and in the holes. Consequently, a conductive material layer is formed on the insulating material film and in the holes so that the holes are filled with the conductive material layer.

However, the layers below the current limiting layer are also influenced by oxidation in the oxidation step. For example, when the first magnetic layer 53 is oxidized in the oxidation step, an oxide film is formed over the entire region in the planar direction to undesirably decrease the contrast between the apertures (holes) and the non-apertures (insulating film) of the current limiting layer.

With an under layer (the first magnetic layer 53 shown in FIG. 18) having high surface energy, the nucleus formation by aggregation shown in FIG. 18 tends to proceed in a complete wetting mode to easily cause single-layer growth (FM mode). Therefore, a base layer of a material which has low surface energy and which is less oxidized is preferably deposited before the current limiting layer 54 is formed.

Figure 21:
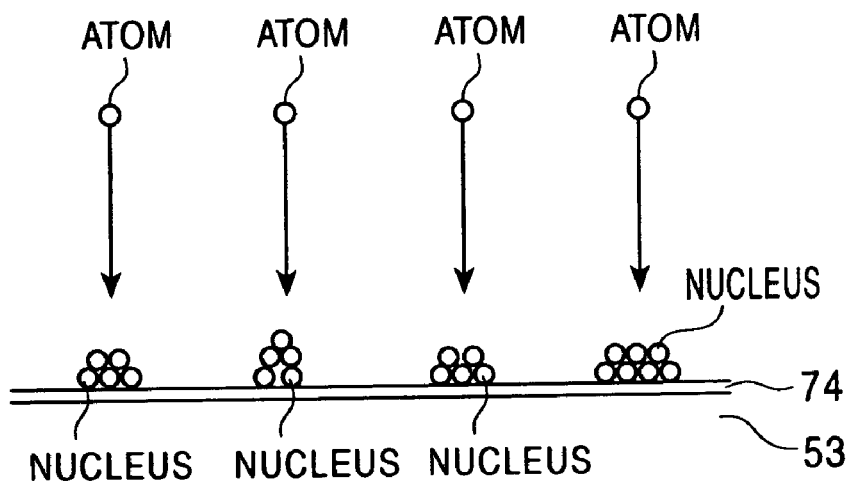
FIG. 21 is a schematic drawing showing the state of the top of a first magnetic layer on which a current limiting layer is formed.
Figure 22:
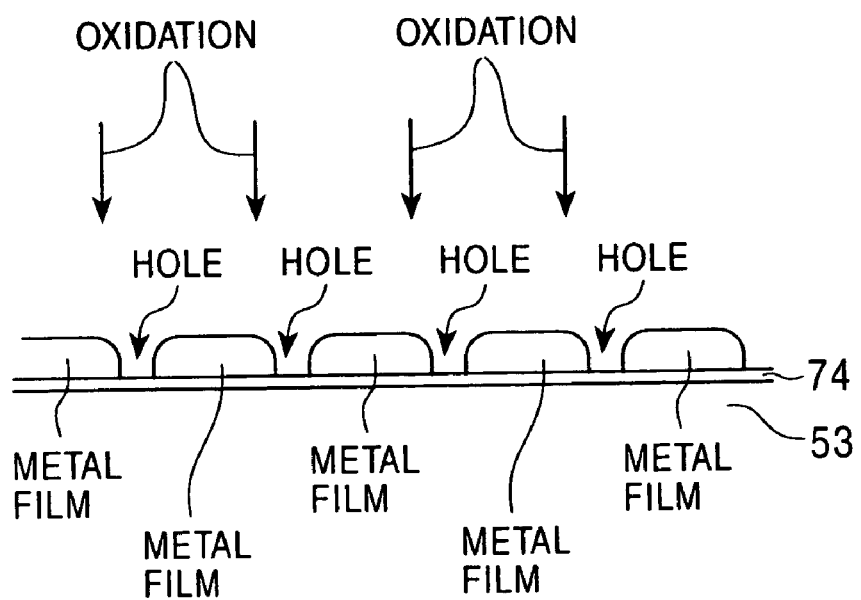
FIG. 22 is a partial schematic drawing showing a state after the step shown in FIG. 21.
Figure 23:
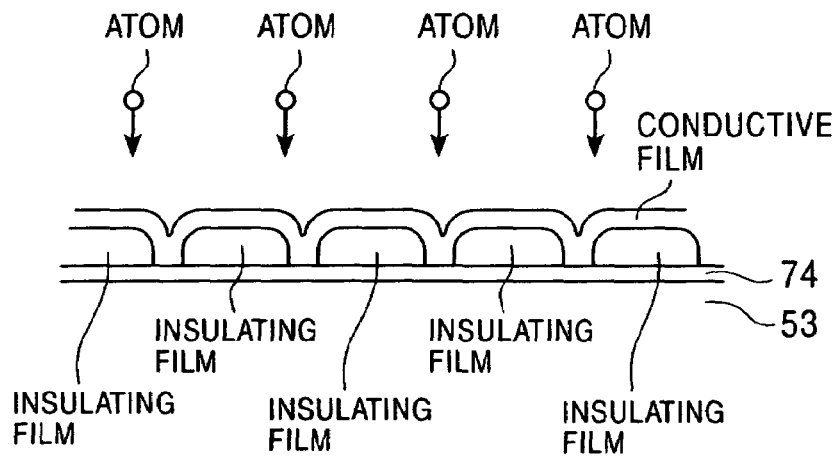
FIG. 23 is a partial schematic drawing showing a state after the step shown in FIG. 22.

This production method comprises the steps shown in FIGS. 21 to 23. As shown in FIG. 21, a noble metal material layer 74 composed of a noble metal element is first formed on the first magnetic layer 53 of the free magnetic layer 26 by sputtering.

In this step, the noble metal material layer 74 preferably comprises at least one noble metal material of Ru, Pt, Au, Rh, Ir, Pd, Os, and Re. Instead of the noble metal material layer 74, a Cu layer composed of Cu may be formed. The noble metal material layer 74 composed of a noble metal element or the Cu layer has lower surface energy than that of the free magnetic layer 26, and is less oxidized.

Next, as shown in FIG. 21, at least one metal element of Ag, Cu, Zn, Ge, Pd, Al, Ti, Zr, Hf, Cr, Ta, V, Nb, Mo, W, Fe, Co, Si, Ni, and the rare earth elements is deposited by sputtering. The metal element easily aggregates to form nuclei on the surface of the noble metal material layer 74.

Thus, the metal element aggregates in, for example, islands to form a plurality of holes extending from the top to the bottom of the metal film, as shown in FIG. 22.

Next, as shown in FIG. 22, the metal film is oxidized by a conventional method such as natural oxidation, plasma oxidation, radical oxidation, or anodic oxidation. As a result, the metal film is changed to the insulating material film comprising an oxide. In this step, oxidation is stopped by the noble metal material layer 74 formed below the metal film because the noble metal material layer 74 is less oxidized, thereby preventing oxidation of the layers below the noble metal material layer 74.

In the step shown in FIG. 23, a conductive film (conductive material film) composed of a metal element is deposited on the insulating material film and in the holes by sputtering. The metal element is preferably the same noble metal element as the base layer. Namely, the conductive film shown in FIG. 23 is preferably made of at least one noble metal material of Ru, Pt, Au, Rh, Ir, Pd, Os, and Re, or the conductive film may be made of Cu.

When the conductive film is composed of an element other than the noble metal element, oxygen moves from the insulating material film to the second magnetic layer 55 formed on the current limiting layer 54 in subsequent heat treatment or the like to decrease the contrast between the aperture and the non-apertures due to a diffused oxygen distribution.

Furthermore, when a noble metal material layer 75 comprising the same material as the noble metal material layer 74 is deposited on the current limiting layer 54 by sputtering, oxygen does not diffuse to a layer formed on the current limiting layer 54 even in subsequent heat treatment, and thus a contrast between an oxidized portion and an unoxidized portion of the current limiting layer 54 can be maintained high.

In the present invention, two targets including a target composed of an insulating material and a target composed of a conductive material may be sputtered. In this case, the current limiting layer 54 containing particles of the insulating material and particles of the conductive material can be formed on the first magnetic layer 53. As the insulating material and the conductive material, the above-described materials may be used. However, in the present invention, the current limiting layer 54 comprising conductive particles dispersed in the insulating material film can be formed by using the materials described below.

Specifically, in the present invention, the current limiting layer 54 is deposited by sputtering on the top of the first magnetic layer 53, the current limiting layer 54 having a composition represented by the formula $Fe_aM_bO_c$ (wherein element M is at least one element selected from Ti, Zr, Hf, Nb, Ta, Mo, W and the rare earth elements) wherein the composition ratios a, b and c by atomic % satisfy the relationships $40 \leq a \leq 50$, $10 \leq b \leq 30$, $20 \leq c \leq 40$, and a+b+c=100, and a film structure comprising microcrystal grains mainly composed of Fe and dispersed in an amorphous phase containing an compound of the element M of O.

The current limiting layer 54 deposited by sputtering on the top of the first magnetic layer 53 may have a composition represented by the formula $Fe_dM_eN_f$ (wherein element M is at least one element selected from Ti, Zr, Hf, Nb, Ta, Mo, W and the rare earth elements) wherein the composition ratios d, e and f by atomic % satisfy the relationships $60 \leq d \leq 70$, $10 \leq e \leq 15$, $19 \leq f \leq 25$, and d+e+f=100, and a film structure comprising microcrystal grains mainly composed of Fe and dispersed in an amorphous phase containing an compound of the element M and N.

In order to deposit the FeMO or FeMN alloy, the two targets, for example, a Fe target and a target of MO or MN may be prepared, and then sputtered to form the current limiting layer 54 having the above-descried composition ratios and film structure.

In the present invention, the current limiting layer 54 may be formed by depositing Co and at least one metal material of Ru, Pt, Au, Rh, Ir, Pd, Os, Re, Cu and Ag, and then oxidizing Co by heat treatment.

However, the step of forming the current limiting layer 54 containing Co and the noble metal element or depositing the FeMO or FeMN alloy comprises the step of promoting oxidation by heat treatment, and thus oxidation possibly proceeds to a layer below the current limiting layer 54 by the heat treatment.

Therefore, in forming the current limiting layer 54 containing Co and the noble metal element or the current limiting layer 54 comprising the FeMO alloy or FeMN alloy, i.e., the current limiting layer 54 comprising a so-called granular film, the noble metal material layer 74 composed of the noble metal element is preferably first formed on the first magnetic layer 53. The noble metal material layer 74 is made of at least one noble metal material of Ru, Pt, Au, Rh, Ir, Pd, Os and Re. Instead of the noble metal material layer 74, a Cu layer may be formed. However, the noble metal material layer 74 is more preferably used.

Figure 24:
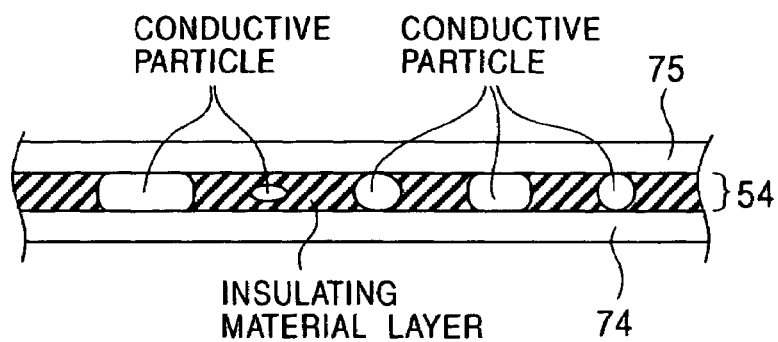
FIG. 24 is a schematic drawing showing the state of the top of a first magnetic layer on which a current limiting layer is formed.

In the step shown in FIG. 24, the current limiting layer 54 comprising the FeMO or FeMN alloy is deposited on the noble metal material layer 74. Furthermore, the noble metal material layer 75 is preferably formed on the current limiting layer 54. The material of the noble metal material layer 75 is the same as the noble metal material layer 74. In stead of the noble metal material layer 75, a Cu layer may be formed.

After the noble metal material layer 74, the current limiting layer 54 and the noble metal material layer 75 are deposited, heat treatment is performed to promote a granular phase separation in the current limiting layer 54, thereby increasing the contrast between the oxidized portion and the unoxidized portion. In this step, oxidation does not reach the layers above and below the current limiting layer 54 because the current limiting layer 54 is held between the noble metal material layers 74 and 75.

Figure 25:
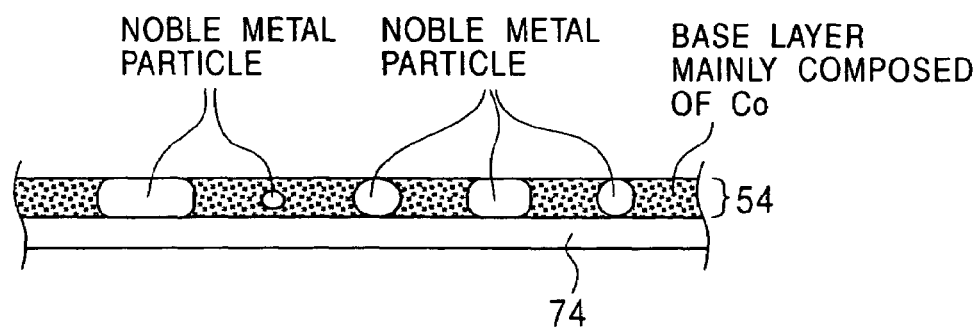
FIG. 25 is a schematic drawing showing the state of the top of a first magnetic layer on which a current limiting layer is formed.

In the step shown in FIG. 25, the noble metal material layer 74 is deposited on the first magnetic layer 53 by sputtering, and then a material containing Co and at least one metal material of Ru, Pt, Au, Rh, Ir, Pd, Os, Re, Cu and Ag is deposited on the noble metal material layer 74 by sputtering. Then, annealing is performed to accelerate phase separation. In the step shown in FIG. 26, a portion mainly composed of base metal element Co is oxidized by natural oxidation, plasma oxidation, radical oxidation or the like to form an insulating portion. On the other hand, noble metal particles composed of Au or the like are not oxidized to remain as conductive particles, forming a conductive portion.

In the heat treatment and oxidation, oxidation does not reach the layer below the current limiting layer 54 because the noble metal material layer 74 is provided below the current limiting layer 54.

Figure 27:
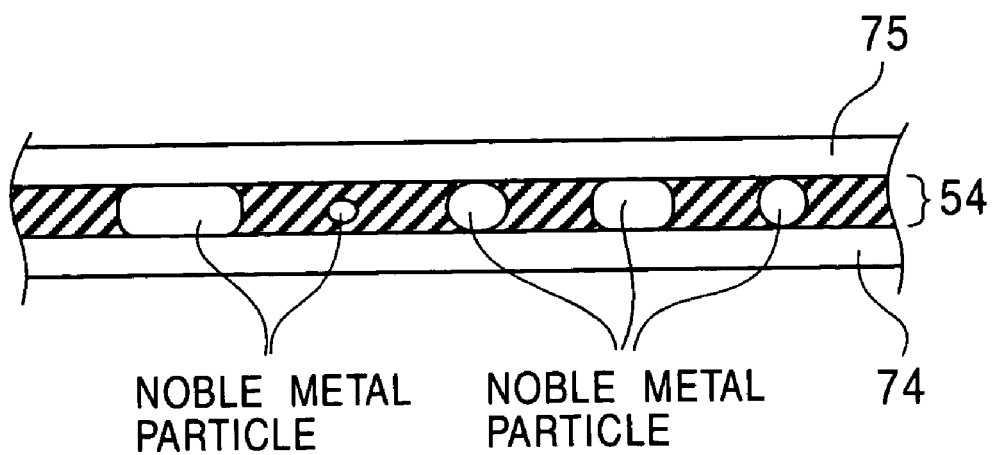
FIG. 27 is a partial schematic drawing showing a state after the step shown in FIG. 26.
Figure 28:
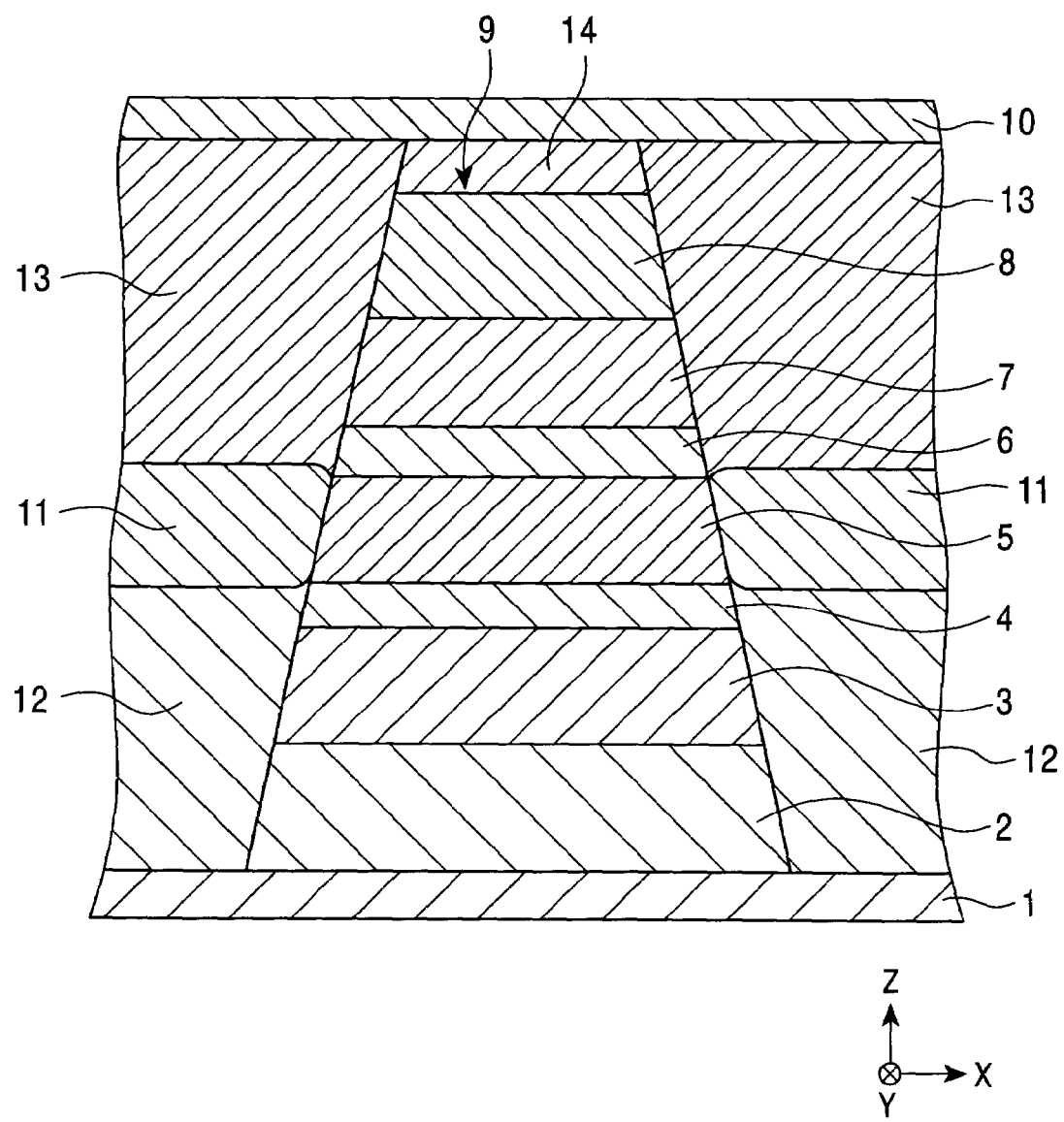
FIG. 28 is a sectional drawing of a conventional magnetic detecting element, as viewed from a side facing a recording medium.

In the step shown in FIG. 27, the noble metal material layer 75 is deposited on the current limiting layer 54 by sputtering. In this way, the top of the current limiting layer 54 is capped with the noble metal material layer 75 to prevent oxygen diffusion to a layer formed above the current limiting layer 54 in subsequent heat treatment or the like, thereby keeping the high contrast between the oxidized portion and the unoxidized portion of the current limiting layer 54.

In both the steps shown in FIGS. 24 and 25, the thickness of the current limiting layer 54 is preferably smaller than the particle diameter of the conductive particles, otherwise a current path is not property formed for the sensing current flowing from the top to the bottom of the current limiting layer 54, thereby failing to sufficiently narrow the current path of the sensing current and to improve the reproduction output.

Figure 26:
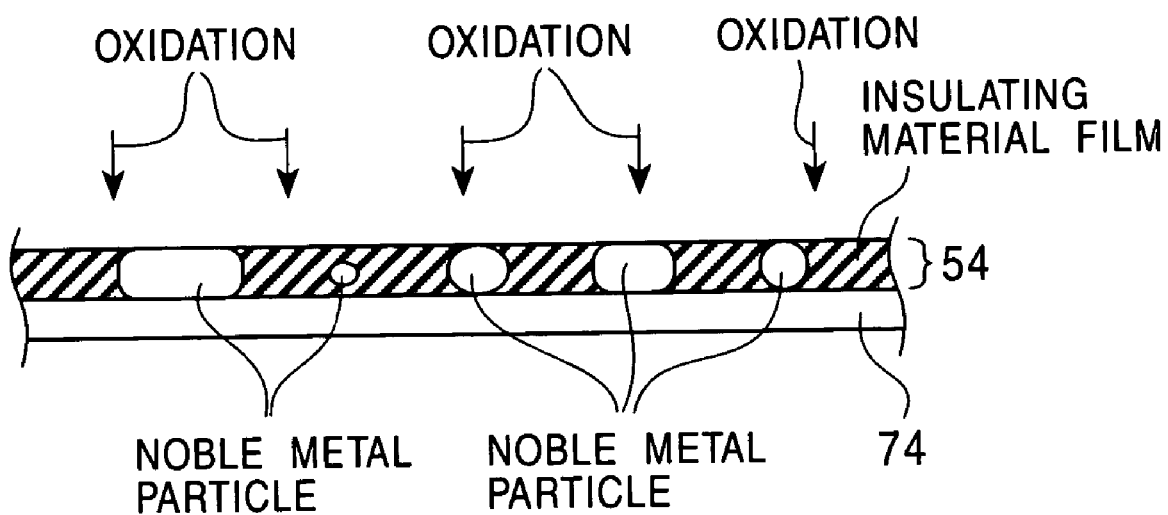
FIG. 26 is a partial schematic drawing showing a state after the step shown in FIG. 25.

Although, in the steps shown in FIGS. 22 and 26, oxidation is performed to form the insulating material film comprising an oxide, nitriding may be performed.

FIG. 9 shown the magnetic detecting element in which the noble metal material layers 74 and 75 are formed above and below the current limiting layer 54.

In forming the magnetic detecting element shown in FIG. 5, the in-stack bias layer 80 is formed on the electrode layer 20 by using CoPt or the like in the step shown in FIG. 15. Then, the underlying layer 21, the seed layer 22, the antiferromagnetic layer 23, the pinned magnetic layer 24, the nonmagnetic material layer 25, the free magnetic layer 26 (the first magnetic layer 53, the current limiting layer 54, and the second magnetic layer 55), the nonmagnetic material layer 27, the pinned magnetic layer 28, the antiferromagnetic layer 29, the intermediate layer 81 and the in-stack bias layer 82 are formed in a solid film.

Next, the same step as that shown in FIG. 16 is performed, and then the insulating layers 83 are deposited on both sides of the multilayer film T2 having a substantially trapezoidal shape. Furthermore, the second electrode layer 30 is formed, and then the in-stack bias layers 80 and 82 are magnetized in antiparallel to the track width direction at room temperature.

In forming the magnetic detecting element shown in FIG. 6, the magnetic layers 50 and 52 of the pinned magnetic layer 24 are formed by using magnetic materials having the same composition, and the thickness t9 of the magnetic layer 50 is smaller than the thickness t10 of the magnetic layer 52 (t9<t10). Also, the magnetic layers 60 and 62 of the pinned magnetic layer 28 are formed by using magnetic materials having the same composition, and the thickness t12 of the magnetic layer 62 is larger than the thickness t11 of the magnetic layer 60 (t12>t11). In this state, annealing is performed in a magnetic field in the height direction (the Y direction) to produce an exchange coupling magnetic field between the antiferromagnetic layer 23 and the magnetic layer 50 of the pinned magnetic layer 24, and between the antiferromagnetic layer 29 and the magnetic layer 62 of the pinned magnetic layer 28.

The temperature of the magnetic field annealing is, for example, 270° C., and the magnitude of the magnetic field is 8 to 30 kA/m, for example, 24 kA/m.

Since the magnetic moment per unit area of the magnetic layer 50<the magnetic moment per unit area of the magnetic layer 52, and the magnetic moment per unit area of the magnetic layer 62>the magnetic moment per unit area of the magnetic layer 60, magnetization of the magnetic layer 50 is oriented in antiparallel to the height direction by the magnetic field annealing, while magnetization of the magnetic layer 62 is oriented in the height direction. Also, the magnetic layer 52 is pinned in the height direction, and the magnetic layer 60 is pinned in antiparallel to the height direction (the Y direction) by the RKKY interaction through the intermediate layers 51 and 61, respectively. Namely, the magnetization directions of the magnetic layers 52 and 60 can be aligned in antiparallel to each other by one time of magnetic field annealing.

Even when the thickness t9 of the magnetic layer 50 is larger than the thickness t10 of the magnetic layer 52 (t9>t10), and the thickness t12 of the magnetic layer 62 is smaller than the thickness t11 of the magnetic layer 60 (t12<t11), the magnetization directions of the magnetic layers 52 and 60 can be aligned in antiparallel to each other by one time of magnetic field annealing.

Another method for aligning the magnetization directions of the magnetic layer 52 of the pinned magnetic layer 24 and the magnetic layer 60 of the pinned magnetic layer 28 in antiparallel to each other will be described below.

First, the underlying layer 21, the seed layer 22, the antiferromagnetic layer 23, the pinned magnetic layer 24, the nonmagnetic material layer 25, and the first magnetic layer 53 and the current limiting layer 54 of the free magnetic layer 26 are deposited on the electrode layer 20, and then first magnetic field annealing is performed in a magnetic field, for example, in the height direction. Next, the second magnetic layer 55 of the free magnetic layer 26, the nonmagnetic material layer 27, the pinned magnetic layer 28 and the antiferromagnetic layer 29 are laminated on the current limiting layer 54, and then second magnetic field annealing is performed in a magnetic field in a direction antiparallel to the magnetic field direction of the first magnetic field annealing.

When the thickness t12 of the magnetic layer 62 is smaller than the thickness t11 of the magnetic layer 60 (t12<t11), and the first magnetic field annealing is performed in a magnetic field (for example, a magnetic field of 800 kA/m or more) larger than the saturation magnetic field of the pinned magnetic layer 24, the second magnetic field annealing is performed in a magnetic field which is lower than the spin flop magnetic field of each of the pinned magnetic layer 24 and 28 in the same direction as the magnetic field direction of the first magnetic field annealing.

The heat treatment temperature of the first magnetic field annealing is, for example, 270° C., and the magnitude of the magnetic field is, for example, 800 kA/m.

In the second magnetic field annealing, the second applied magnetic field is lower than an exchange coupling magnetic field between the lower antiferromagnetic layer 23 and the magnetic layer 50 of the pinned magnetic layer 24, and lower than the spin flop magnetic field between the magnetic layers 50 and 52, and the heat treatment temperature is lower than the blocking temperature of the antiferromagnetic layer 23. In this case, the exchange anisotropic magnetic field between the upper antiferromagnetic layer 29 and the magnetic layer 62 of the pinned magnetic layer 28 can be oriented in the height direction, while the exchange coupling magnetic field between the antiferromagnetic layer 23 and the magnetic layer 50 is oriented in antiparallel to the height direction.

The heat treatment temperature of the second magnetic field annealing is, for example, 250° C., and the magnitude of the magnetic field is 8 to 30 kA/m, for example, 24 kA/m. The magnitude of the second applied magnetic field is larger than the coercive force of the upper pinned magnetic layer 28.

In the method comprising performing two times of magnetic field annealing, the magnetic layers 50 and 52 of the pinned magnetic layer 24 may be formed by using magnetic materials having the same composition so that the thickness t9 of the magnetic layer 50 is not less than the thickness t10 of the magnetic layer 52 (t9≧t10), and the magnetic layers 60 and 62 of the pinned magnetic layer 28 may be formed by using magnetic materials having the same composition so that the thickness t12 of the magnetic layer 62 is not less than the thickness t11 of the magnetic layer 60 (t12≧t11). In this case, the magnetization directions of the magnetic layer 52 of the pinned magnetic layer 24 and the magnetic layer 60 of the pinned magnetic layer 28 can be oriented in antiparallel to each other. This is true for the case in which the thickness t9 of the magnetic layer 50 is not more than the thickness t10 of the magnetic layer 52 (t9≦t10), and the thickness t12 of the magnetic layer 62 is not more than the thickness t11 of the magnetic layer 60 (t12≦t11).

In the construction in which t9≧t10 and t12≧t11, or t9≦t10 and t12≦t11, the magnitude of a one-direction anisotropic magnetic field Hex* between the lower antiferromagnetic layer 23 and the pinned magnetic layer 24 can easily be set to substantially the same value as that between the upper antiferromagnetic layer 29 and the pinned magnetic layer 28.

In forming the magnetic detecting element shown in FIG. 7, the magnetization directions of the magnetic layer 52 of the pinned magnetic layer 24 and the magnetic layer 60 of the pinned magnetic layer 28 are oriented in antiparallel to each other by the same method as that for forming the magnetic detecting element shown in FIG. 6. After the magnetization directions of the magnetic layer 52 of the pinned magnetic layer 24 and the magnetic layer 60 of the pinned magnetic layer 28 are pinned, the in-stack bias layer 82 is magnetized in a direction antiparallel to the track width direction at room temperature.

In forming the magnetic detecting element shown in FIG. 8, ferromagnetic coupling between the magnetic layer 73 and the second magnetic layer 55 through the current limiting layer 54 is weakened so that the magnetization directions of the magnetic layer 73 of the first magnetic layer 70 and the second magnetic layer 55 of the free magnetic layer 84 are oriented in antiparallel to each other.

Furthermore, the first magnetic layer 70 is formed in the laminated ferrimagnetic structure comprising the magnetic layers 73 and 71 laminated with the nonmagnetic intermediate layer 72 provided therebetween, so that the magnetic layers 73 and 71 are antiferromagnetically coupled with each other by the RKKY interaction.

Therefore, the magnetization directions of uppermost second magnetic layer 55 and the lowermost magnetic layer 71 of the free magnetic layer 84 are oriented in parallel to each other.

Furthermore, the magnetic layers 50 and 52 of the pinned magnetic layer 24 are formed by using magnetic materials having the same composition, and the thickness t3 of the magnetic layer 50 is smaller than the thickness t4 of the magnetic layer 52. Also, the magnetic layers 60 and 62 of the pinned magnetic layer 28 are formed by using magnetic materials having the same composition, and the thickness t5 of the magnetic layer 62 is smaller than the thickness t6 of the magnetic layer 60.

Therefore, the magnetic moment per unit area of the magnetic layer 50<the magnetic moment per unit area of the magnetic layer 52, and the magnetic moment per unit area of the magnetic layer 62<the magnetic moment per unit area of the magnetic layer 60. In this state, annealing is performed in a magnetic field in the height direction (the Y direction) to produce an exchange coupling magnetic field between the antiferromagnetic layer 23 and the magnetic layer 50 of the pinned magnetic layer 24 and between the antiferromagnetic layer 29 and the magnetic layer 62 of the pinned magnetic layer 28.

The temperature of the magnetic field annealing is, for example, 270° C., and the magnitude of the magnetic field is 800 kA/m or more or 8 to 30 kA/m, for example, 24 kA/m.

In the one time of magnetic field annealing, the magnetization directions of the magnetic layers 52 and 60 can be pinned in a direction antiparallel to the height direction (annealing in a magnetic field of 800 kA/m or more) or in the height direction (annealing in a magnetic field of 8 to 30 kA/m).

Furthermore, after the magnetization directions of the magnetic layer 52 of the pinned magnetic layer 24 and the magnetic layer 60 of the pinned magnetic layer 28 are pinned, the in-stack bias layer 82 is magnetized in a direction antiparallel to the track width direction at room temperature.

Although, in the above-described embodiments, the free magnetic layer comprises the first and second magnetic layers laminated with the current limiting layer provided therebetween, the free magnetic layer may comprise three or more magnetic layers, and current limiting layers formed between the respective magnetic layers.

In the present invention described in detail above, the current limiting layer is formed in the free magnetic layer or between the free magnetic layer and the nonmagnetic material layer, and thus the current density of the sensing current flowing through the free magnetic layer can be securely locally increased.

Therefore, in the present invention, even when the element area (referred to as the "optical element area") of the free magnetic layer in parallel to the film plane is 0.01 μm² or more, the element area (referred to as the "effective element area") in which the sensing current actually flows through the free magnetic layer to contribute to the magnetoresistive effect can be securely decreased. Therefore, a CPP-type magnetic detecting element exhibiting high ΔR and high reproduction output can easily be formed.

Also, the element area of the free magnetic layer can be increased to 0.01 μm² or more, and thus an external magnetic field from a recording medium can be effectively detected to improve reproduction output and the stability of a reproduction waveform.

What is claimed is:

1. A magnetic detecting element comprising:
 a multilayer film comprising a laminate of a free magnetic layer, a nonmagnetic material layer, a pinned magnetic layer and an antiferromagnetic layer; wherein a current flows perpendicularly to a film plane of each of the layers of the multilayer film, and the free magnetic layer comprises a plurality of soft magnetic layers which are laminated with a current limiting layer disposed therebetween, the current limiting layer comprising an insulating portion and a conductive portion;
 wherein the insulating portion of the current limiting layer comprises an insulating material film having a plurality of holes extending from a top to a bottom of the current limiting layer, the holes being filled with a conductive material film serving as the conductive portion;
 wherein the holes have an opening ratio in the current limiting layer of from about 10% to 30%, and
 wherein the conductive portion of the current limiting layer comprises conductive particles, and a thickness of the current limiting layer is smaller than a particle size of the conductive particles.

2. A magnetic detecting element according to claim 1, further comprising an in-stack bias layer laminated at least one of above and below the free magnetic layer, for aligning magnetization of the free magnetic layer.

3. A magnetic detecting element according to claim 1, wherein magnetizations of the plurality of soft magnetic layers are parallel to each other.

4. A magnetic detecting element according to claim 3, wherein the plurality of soft magnetic layers are ferromagnetically coupled with each other through the current limiting layer.

5. A magnetic detecting element according to claim 1, wherein magnetizations of the plurality of the soft magnetic layers are antiparallel to each other.

6. A magnetic detecting element according to claim 1, wherein the plurality of the soft magnetic layers constituting the free magnetic layer have a same magnetic moment per unit area.

7. A magnetic detecting element according to claim 1, wherein the plurality of the soft magnetic layers constituting the free magnetic layer have different magnetic moments per unit area.

8. A magnetic detecting element according to claim 5, wherein the free magnetic layer comprises a nonmagnetic intermediate layer composed of at least one nonmagnetic material of Ru, Rh, Ir, Os, Re, Cr, and Cu.

9. A magnetic detecting element according to claim 1, wherein the plurality of the soft magnetic layers constituting the free magnetic layer have a same thickness.

10. A magnetic detecting element according to claim 1, wherein the plurality of the soft magnetic layers constituting the free magnetic layer have different thicknesses.

11. A magnetic detecting element comprising:
a multilayer film comprising an upper nonmagnetic material layer, an upper pinned magnetic layer and an upper antiferromagnetic layer, which are laminated above a free magnetic layer, and a lower nonmagnetic material layer, a lower pinned magnetic layer and a lower antiferromagnetic layer, which are laminated below the free magnetic layer;
wherein a current flows perpendicularly to a film plane of each of the layers of the multilayer film, and the free magnetic layer comprises a plurality of soft magnetic layers which are laminated with a current limiting layer disposed therebetween, the current limiting layer comprising an insulating portion and a conductive portion;
wherein the insulating portion of the current limiting layer comprises an insulating material film having a plurality of holes extending from a top to a bottom of the current limiting layer, the holes being filled with a conductive material film serving as the conductive portion;
wherein the holes have an opening ratio in the current limiting layer of from about 10% to 30%, and
wherein the conductive portion of the current limiting layer comprises conductive particles, and a thickness of the current limiting layer is smaller than a particle size of the conductive particles.

12. A magnetic detecting element according to claim 11, further comprising an in-stack bias layer laminated at least one of above and below the free magnetic layer, for aligning magnetization of the free magnetic layer.

13. A magnetic detecting element according to claim 1 or 2, further comprising hard bias layers formed on both sides of the free magnetic layer in a track width direction, for aligning magnetization of the free magnetic layer.

14. A magnetic detecting element according to claim 1 or 2, wherein the conductive portion of the current limiting layer comprises crystal grains and the insulating portion comprises an amorphous material.

15. A magnetic detecting element according to claim 14, wherein the crystal grains comprise at least one element selected from the group consisting of Fe, Ru, Pt, Au, Rh, Ir, Pd, Os, Re, Cu, and Ag, and the amorphous material comprises an O or N compound with at least one element selected from Al, Co, Ti, Zr, Hf, Nb, Ta, Mo, W, and the rare earth elements.

16. A magnetic detecting element comprising:
a multilayer film comprising a laminate of a free magnetic layer, a nonmagnetic material layer, a pinned magnetic layer and an antiferromagnetic layer; wherein a current flows perpendicularly to a film plane of each of the layers of the multilayer film, and the free magnetic layer comprises a plurality of soft magnetic layers which are laminated with a current limiting layer disposed therebetween, the current limiting layer comprising an insulating portion and a conductive portion;
wherein the insulating portion of the current limiting layer comprises an insulating material film having a plurality of holes extending from a top to a bottom of the current limiting layer, the holes being filled with a conductive material film serving as the conductive portion;
wherein the holes have an opening ratio in the current limiting layer of from about 10% to 30%, and
wherein the free magnetic layer comprises at least three soft magnetic layers which are laminated with the current limiting layer disposed therebetween.

17. A magnetic detecting element comprising:
a multilayer film comprising a laminate of a free magnetic layer, a nonmagnetic material layer, a pinned magnetic layer and an antiferromagnetic layer; wherein a current flows perpendicularly to a film plane of each of the layers of the multilayer film, and the free magnetic layer comprises at least three soft magnetic layers which are laminated with a current limiting layer disposed therebetween, the current limiting layer comprising an insulating portion and a conductive portion;
wherein the insulating portion of the current limiting layer comprises an insulating material film having a plurality of holes extending from a top to a bottom of the current limiting layer, the holes being filled with a conductive material film serving as the conductive portion.

18. A magnetic detecting element comprising:
a multilayer film comprising an upper nonmagnetic material layer, an upper pinned magnetic layer and an upper antiferromagnetic layer, which are laminated above a free magnetic layer, and a lower nonmagnetic material layer, a lower pinned magnetic layer and a lower antiferromagnetic layer, which are laminated below the free magnetic layer;
wherein a current flows perpendicularly to a film plane of each of the layers of the multilayer film, and the free magnetic layer comprises at least three soft magnetic layers which are laminated with a current limiting layer provided therebetween, the current limiting layer comprising an insulating portion and a conductive portion;
wherein the insulating portion of the current limiting layer comprises an insulating material film having a plurality of holes extending from a top to a bottom of the current limiting layer, the holes being filled with a conductive material film serving as the conductive portion.

19. A magnetic detecting element comprising:
a multilayer film comprising an upper nonmagnetic material layer, an upper pinned magnetic layer and an upper antiferromagnetic layer, which are laminated above a free magnetic layer, and a lower nonmagnetic material layer, a lower pinned magnetic layer and a lower antiferromagnetic layer, which are laminated below the free magnetic layer;

wherein a current flows perpendicularly to a film plane of each of the layers of the multilayer film, and the free magnetic layer comprises a plurality of soft magnetic layers which are laminated with a current limiting layer disposed therebetween, the current limiting layer comprising an insulating portion and a conductive portion;

wherein the insulating portion of the current limiting layer comprises an insulating material film having a plurality of holes extending from a top to a bottom of the current limiting layer, the holes being filled with a conductive material film serving as the conductive portion;

wherein the holes have an opening ratio in the current limiting layer of from about 10% to 30%, and wherein the free magnetic layer comprises at least three soft magnetic layers which are laminated with the current limiting layer disposed therebetween.

* * * * *